US010533887B2

(12) United States Patent
Rondano et al.

(10) Patent No.: US 10,533,887 B2
(45) Date of Patent: *Jan. 14, 2020

(54) SENSOR FOR DETECTING THE LEVEL OF A MEDIUM

(71) Applicant: ELTEK S.p.A., Casale Monferrato (Alessandria) (IT)

(72) Inventors: Matteo Rondano, Casale Monferrato (IT); Enrico Chiesa, Casale Monferrato (IT); Mauro Zorzetto, Casale Monferrato (IT); Domenico Cantarelli, Casale Monferrato (IT)

(73) Assignee: ELTEK S.p.A., Casale Monferrato (Alessandria) (IT)

( * ) Notice: Subject to any disclaimer, the term of this patent is extended or adjusted under 35 U.S.C. 154(b) by 240 days.

This patent is subject to a terminal disclaimer.

(21) Appl. No.: 15/511,401

(22) PCT Filed: Sep. 14, 2015

(86) PCT No.: PCT/IB2015/057043
§ 371 (c)(1),
(2) Date: Mar. 15, 2017

(87) PCT Pub. No.: WO2016/042459
PCT Pub. Date: Mar. 24, 2016

(65) Prior Publication Data
US 2017/0261361 A1 Sep. 14, 2017

(30) Foreign Application Priority Data

Sep. 15, 2014 (IT) .............................. TO2014A0726

(51) Int. Cl.
*G01F 23/26* (2006.01)
(52) U.S. Cl.
CPC .......... *G01F 23/268* (2013.01); *G01F 23/265* (2013.01); *G01F 23/266* (2013.01)

(58) Field of Classification Search
CPC ...... G01F 23/265; G01F 23/26; G01F 23/263; G01F 23/266; G01F 23/268
(Continued)

(56) References Cited

U.S. PATENT DOCUMENTS 8,558,361 B2 10/2013 Kawaguchi
2005/0280424 A1* 12/2005 Qu .................. G01F 23/265
324/663

(Continued)

FOREIGN PATENT DOCUMENTS

WO WO 2010/139974 12/2010

OTHER PUBLICATIONS

[Online], "Automotive PSoC Programmable System-on-Chip (TM) CY8C24894", Jun. 5, 2014, 51 pages.
(Continued)

*Primary Examiner* — Eric S. McCall
*Assistant Examiner* — Timothy P Graves
(74) *Attorney, Agent, or Firm* — Nixon & Vanderhye P.C.

(57) ABSTRACT

A sensor for detecting the level of a medium contained in a container, in particular a tank, comprises: an array of capacitive elements designed to be associated to the container (1), in particular so as to extend according to an axis of detection (X) of the level of the medium (L), the array of capacitive elements comprising a plurality of electrodes (Ji-Jn), in particular on a face of an electrically insulating substrate (20) having a generally elongated shape, the electrodes (Ji-Jn) being spaced apart from one another, in particular along the detection axis (X), and being preferably substantially coplanar with one another; at least one insulation layer (16) for insulating electrically the electrodes (Ji-Jn) with respect to the inside of the container (1); and a controller (24) having a plurality of inputs. Each capacitive element comprises at least one of a single electrode and a set of (Continued)

electrodes connected together in common, in particular in parallel, the single electrode or the set of electrodes being connected to a respective input of the plurality of inputs. The controller (24) is pre-arranged for discriminating a value of capacitance associated to each electrode (Ji-Jn) in order to deduce the level of the medium present container.

18 Claims, 22 Drawing Sheets

(58) Field of Classification Search
    USPC .................................................. 73/304 C
    See application file for complete search history.

(56) References Cited

U.S. PATENT DOCUMENTS

| | | | | |
|---|---|---|---|---|
| 2008/0088595 | A1* | 4/2008 | Liu | G06F 3/044 |
| | | | | 345/173 |
| 2008/0250796 | A1* | 10/2008 | Clugston | B60S 1/0822 |
| | | | | 62/66 |
| 2009/0009195 | A1* | 1/2009 | Seguine | G01D 5/24 |
| | | | | 324/690 |
| 2009/0165552 | A1* | 7/2009 | Sieh | G01F 23/265 |
| | | | | 73/304 C |
| 2009/0224776 | A1* | 9/2009 | Keith | H03K 17/962 |
| | | | | 324/686 |
| 2009/0301189 | A1* | 12/2009 | Ross, Jr. | G01F 23/265 |
| | | | | 73/304 C |

OTHER PUBLICATIONS

International Search Report and Written Opinion of the ISA for PCT/IB2015/054020, dated Dec. 18, 2015, 16 pages.
International Search Report for PCT/IB2015/057036, dated Mar. 31, 2016, 7 pages.
Written Opinion of the ISA for PCT/IB2015/057036, dated Mar. 31, 2016, 7 pages.
International Search Report and Written Opinion of the ISA for PCT/IB2015/057043, dated Jan. 12, 2016, 18 pages.
[Online], H. Shruti et al., "Designing a Capacitive Sensing System for a Specific Application", *Published in EE Times*, Dec. 1, 2011, 14 pages.

* cited by examiner

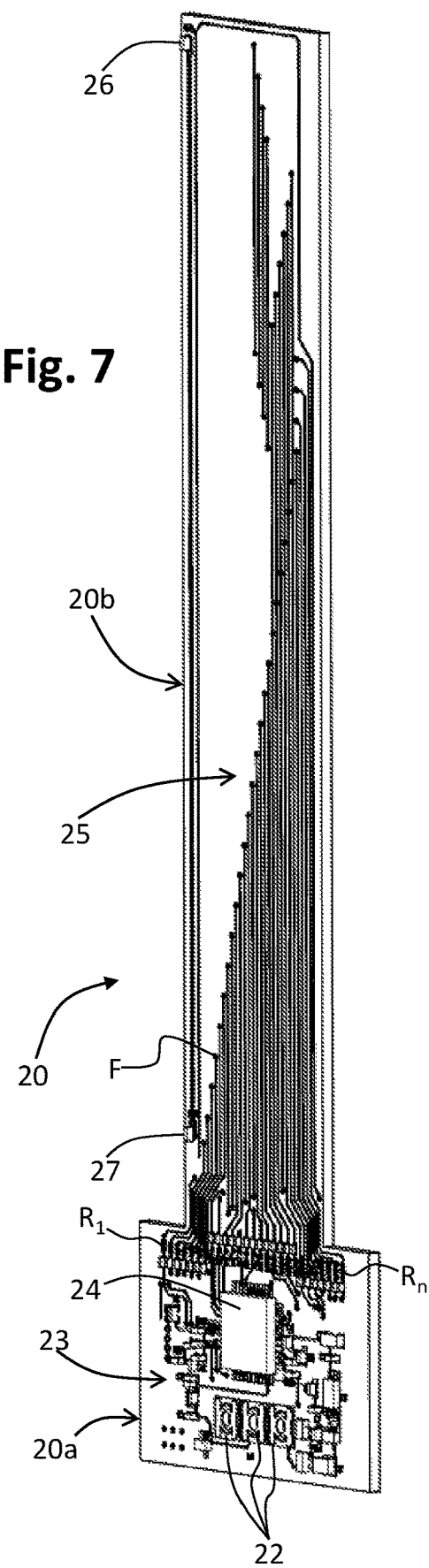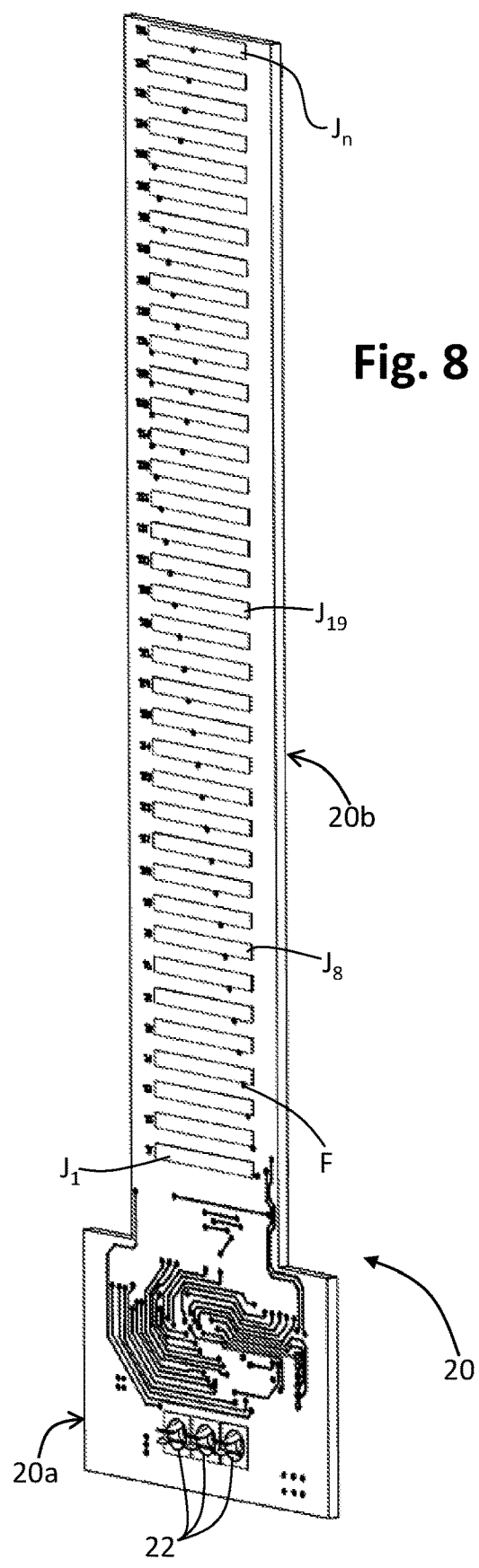

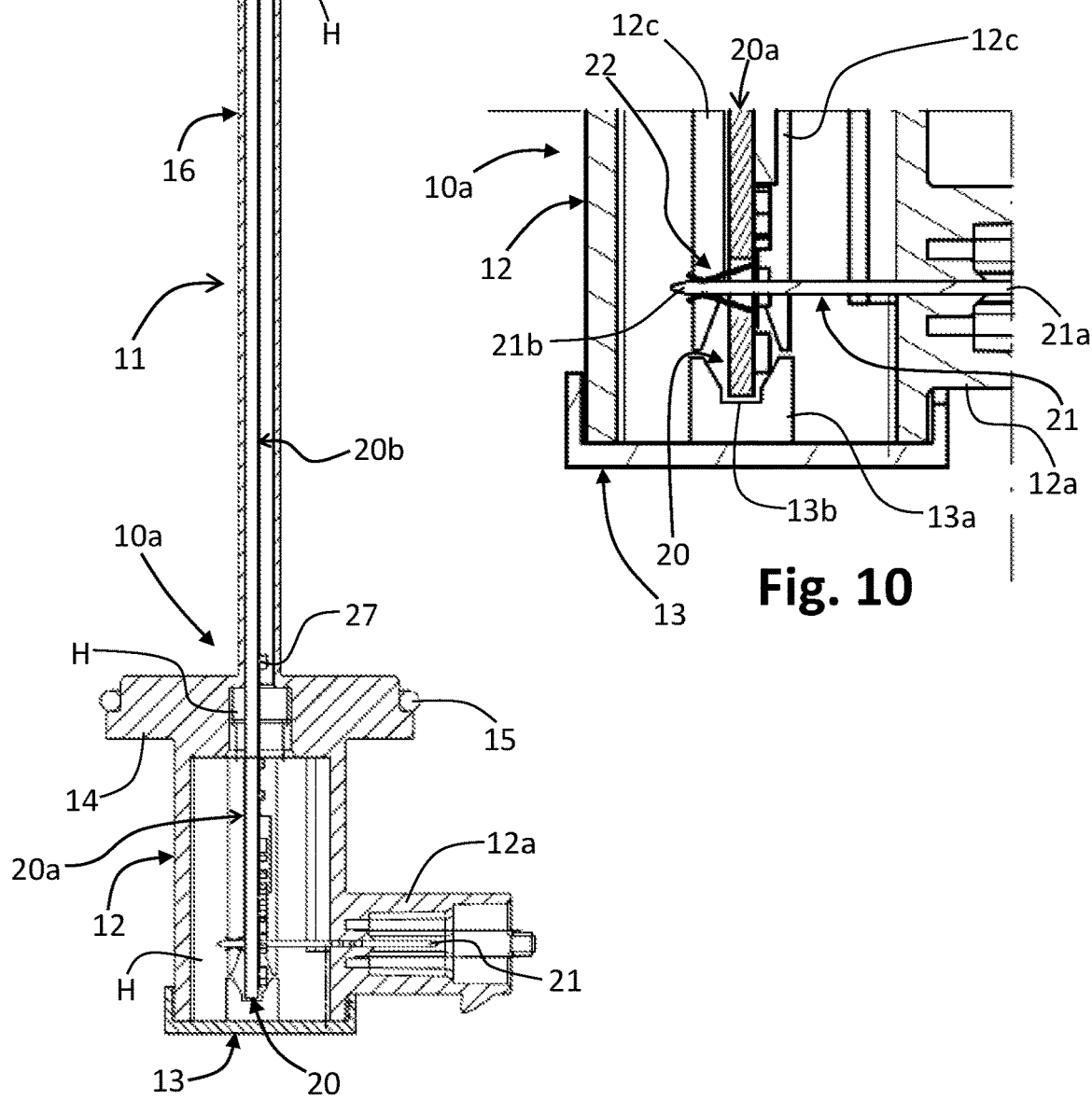

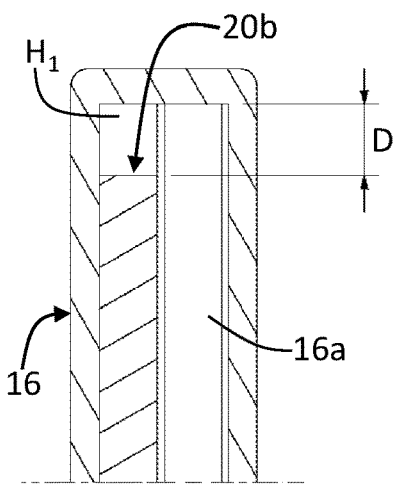
Fig. 12
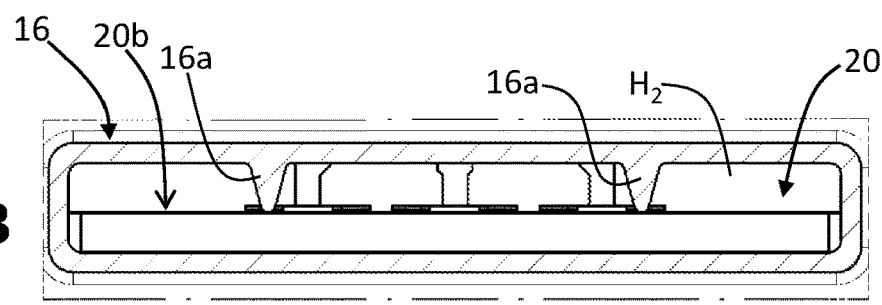
Fig. 13
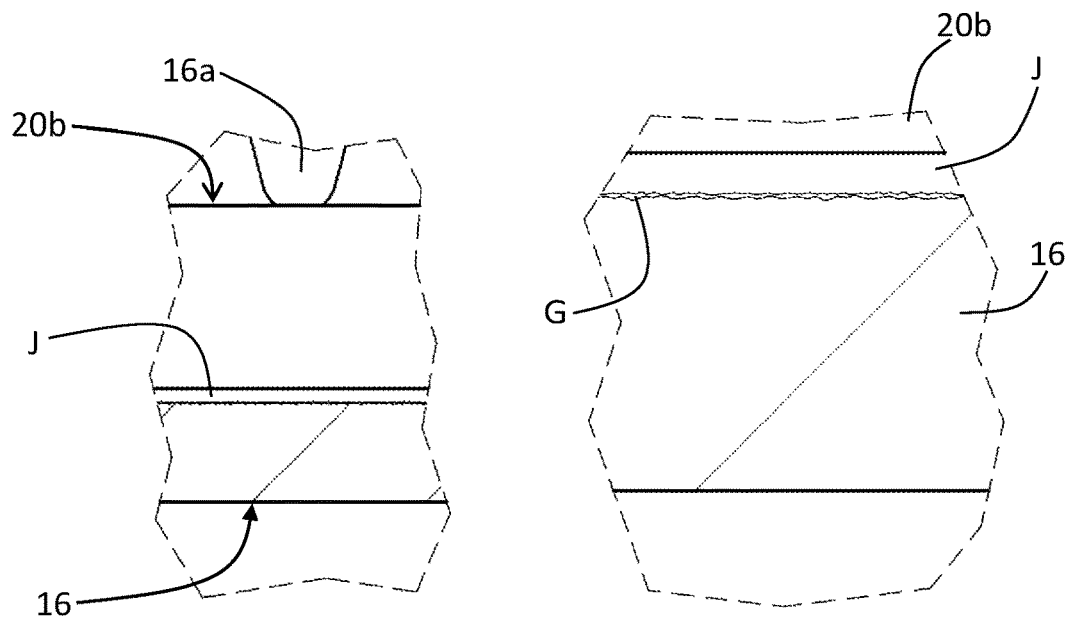
Fig. 14  Fig. 15

SENSOR FOR DETECTING THE LEVEL OF A MEDIUM

This application is the U.S. national phase of International Application No. PCT/IB2015/057,043 filed 14 Sep. 2015, which designated the U.S. and claims priority to IT Patent Application No. TO2014A000726 filed 15 Sep. 2014, the entire contents of each of which are hereby incorporated by reference.

FIELD OF THE INVENTION

The present invention relates to a sensor for detecting the level of a generic medium, such as a liquid, a fluid substance, a powdery material, or a material in the bulk state, etc. The invention has been developed with particular reference to level sensors of a capacitive type used on vehicles.

PRIOR ART

Level sensors are used in various contexts for detecting a residual amount of a liquid present in a generic container, such as a tank. Some of these sensors are based upon the use of a float. These sensors are in general complicated from the mechanical standpoint and present some critical aspects, such as risks of jamming. These sensors are inevitably affected by problems linked to possible freezing of the medium undergoing measurement.

Also known are level sensors based upon the measurement of electrical quantities, such as conductivity/resistivity or capacitance. These sensors usually have an array of first electrodes, arranged according to the level-detection axis, which is generally vertical, on a corresponding insulating substrate that is to be installed inside the tank. The sensors then have a similar array of second electrodes, set between or facing those of the first array, in such a way that the fluid the level of which is to be measured penetrates between the electrodes of the two arrays. In some solutions, instead of a plurality of second electrodes, a common electrode is provided, having a height at least equal to that of the first array. In other solutions still, it is the tank itself that has an internal surface rendered electrically conductive, for example via a metallization surface, in order to function as common electrode. The electrodes are electrically connected to a circuit arrangement, frequently including a microcontroller, which, by processing the value of the electrical quantity detected between the electrodes, is able to identify an area of transition between the liquid and the air in the tank, which is considered indicative of the level of the liquid.

In these known solutions, the electrodes are directly in contact with the liquid and hence subject to aging and to early wear. Operation of these sensor systems is then strictly linked to the characteristics of the fluid, such as its conductivity/resistivity or its dielectric constant.

With reference to level sensors of a capacitive type, these typically envisage at least two mutually facing electrodes, between which the liquid the level of which is to be detected is to penetrate, with the electrodes that are excited via an oscillator circuit, i.e., a circuit that generates an a.c. or frequency-modulated electrical signal. The circuit detects a variation of the capacitance between the facing electrodes that is proportional to the variation of the dielectric set between the electrodes, i.e., proportional to the level of the liquid set in between, and hence of the capacitance of the sensor element. In these sensors an output signal is thus obtained proportional to the aforesaid variation of capacitance. Known sensors of this type envisage configurations with a respective impedance, which may even behave as antennas and present the problem of generating electromagnetic interference (EMI), this disturbance being such as to interfere with other electronic systems, such as the electronic circuits on board the vehicle. This phenomenon increases with the increase of the extension of the electrodes, i.e., with the increase of the length of the level sensor, which could behave as a transmitting antenna.

Further types of capacitive sensors envisage execution of a measurement between at least two coplanar electrodes, for example in comb-fingered (interdigitated) configuration, that face an insulating wall that separates them from the liquid, where the presence of liquid beyond the insulating wall substantially determines a variation of the dielectric between the two electrodes set alongside one another, thus enabling detection. A sensor of this type is known, for example, from U.S. Pat. No. 7,258,005 B2. In these cases, the spacing between the two electrodes must be well greater than the thickness of the insulating wall, typically greater than twice the wall thickness (i.e., the sum of the thicknesses of the wall set between each of the two electrodes and the fluid to be detected) in such a way that the possible presence of liquid can effectively perturb the capacitance between the electrodes. In addition to causing problems of encumbrance, a solution of this kind presents limits in the measurement resolution or precision.

Other types of capacitive sensor are mounted on the outside of a tank, such as a tank for fuel or for an additive in a vehicle. These types of sensor are, however, penalized by the fact that the tank must envisage large wall thicknesses in order to guarantee the necessary mechanical strength. This entails the need to use signals in frequency having higher power in order to detect the level of the liquid in the tank, and this determines greater risks for the aforesaid electromagnetic interference.

SUMMARY AND OBJECT OF THE INVENTION

In its general terms, the object of the present invention is to provide a level sensor that is simple and inexpensive to produce, distinguished by a high flexibility of use and construction and substantially immune from the problems highlighted above.

According to a first aspect, the object of the invention is to provide a level sensor that can be produced in different lengths, albeit guaranteeing precision and reliability.

According to a different aspect, the object of the invention is to provide a sensor that is suitable for carrying out measurements of level even in conditions of at least partial solidification or freezing of the medium undergoing measurement.

According to a different aspect, the object of the invention is to provide a level sensor that is able to distinguish the presence and/or the height of different layers and/or different states of the medium undergoing measurement, such as a sequence of states and/or layers of the type "liquid-air/gas-solid" or else of the type "liquid-solid", or else of the type "air/gas-solid", or again of the type "liquid-air/gas".

According to a different aspect, the object of the invention is to provide a level sensor that is able to detect variations in height of different layers and/or states of the medium undergoing measurement, such as an increase or reduction of an icy or solidified layer of the medium, for example a measurement of the variations of level in a tank that contains a liquid during freezing and/or unfreezing.

According to a different aspect, the object of the invention is to provide a level sensor having a structure designed to enable precise operation thereof even in the face of stresses due to conditions of freezing and/or solidification and/or heating of the medium undergoing measurement.

At least one of the purposes of the invention is achieved by a level sensor and by a corresponding control method having the characteristics specified in the annexed claims. The claims form an integral part of the technical teaching provided herein in relation to the invention.

BRIEF DESCRIPTION OF THE DRAWINGS

Further objects, characteristics, and advantages of the invention will emerge from the ensuing description, with reference to the annexed drawings, which are provided purely by way of non-limiting example and in which:

FIGS. 7 and 8 are schematic perspective views from different angles of a circuit of a level sensor according to a possible embodiment of the invention;

FIG. 9 is a schematic longitudinal section of a level sensor according to a possible embodiment of the invention;

FIG. 10 is a first detail at a larger scale of the sensor of FIG. 9;

FIG. 11 is a detail at a larger scale of the sensor of FIG. 10;

FIG. 12 is a second detail at a larger scale of the sensor of FIG. 9;

FIG. 13 is a schematic cross-sectional view of a sensing portion of a level sensor according to a possible embodiment of the invention;

FIG. 14 is a detail at a larger scale of the sensor of FIG. 13;

FIG. 15 is a detail at a larger scale of the sensor of FIG. 14;

DESCRIPTION OF PREFERRED EMBODIMENTS OF THE INVENTION

Reference to "an embodiment" or "one embodiment" in the framework of the present description is meant to indicate that a particular configuration, structure, or characteristic described in relation to the embodiment is comprised in at least one embodiment. Hence, phrases such as "in one embodiment", "in one embodiment", and the like that may be present in different points of this description do not necessarily refer to one and the same embodiment, but may instead refer to different embodiments. Moreover, particular conformations, structures, or characteristics defined in the course of the present description may be combined in any adequate way in one or more embodiments, even different from the ones shown. The numeric and spatial references (such as "upper/top", "lower/bottom", "up", "down", "front", "back", "vertical", etc.) used herein are merely provided for convenience and hence do not define the sphere of protection or the scope of the embodiments. In the figures, the same reference numbers are used to indicate elements that are similar or technically equivalent.

Figure 1:
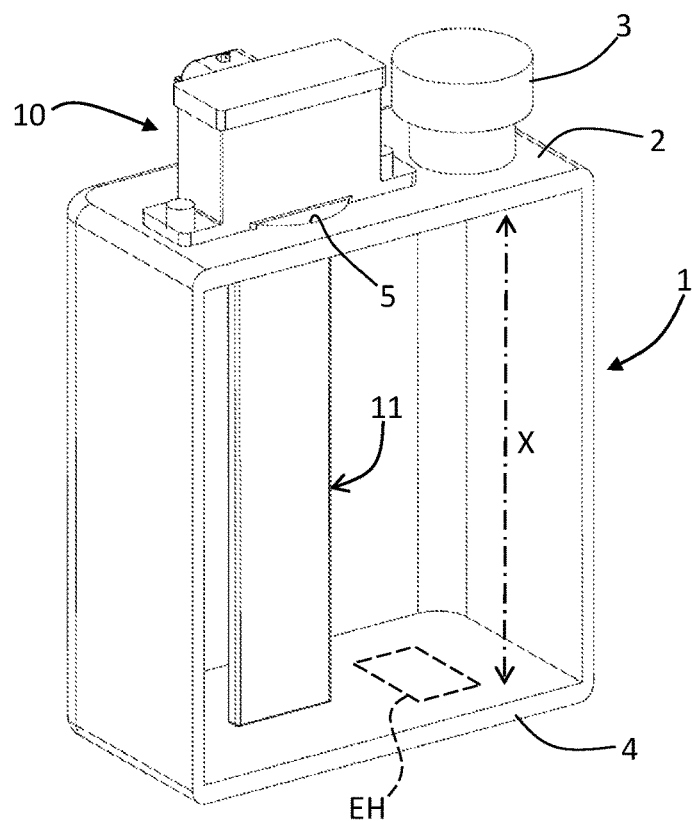
FIGS. 1 and 2 are partially sectioned schematic perspective views of two possible alternative configurations of installation of a level sensor according to the invention on a generic container, such as a tank.

In FIG. 1, designated as a whole by 1 is a generic container, in particular a tank, for a generic medium in the fluid or bulk state. The tank 1 has a main body preferably made of electrically insulating plastic material. To the tank 1 there may be associated a heater of a type in itself known, used for heating the tank itself and/or its contents, for example in the event of freezing. An electrical heater is represented schematically in the figure by the block designated by EH.

The tank 1 may, for example, be a tank that equips a motor vehicle. In one embodiment, such as the one exemplified herein, the tank 1 is designed to equip a vehicle with diesel engine, and the liquid contained in the tank 1 is a liquid known as AdBlue, i.e., a solution of urea at 32.5% (minimum 31.8%-maximum 33.3%) in demineralized water, used by an SCR (Selective Catalyst Reduction) system, i.e., a system for reducing emissions of nitrogen oxides from the exhaust gases produced by a diesel engine.

In the schematic example illustrated, the tank has an upper wall 2, on which an opening is provided having a plug 3 for topping-up. A wall of the tank 1, for example its bottom wall 4, then has an outlet opening, not visible, via which the liquid comes out or is drawn, for example via a pump, to supply the liquid to the SCR system. Once again on the upper wall 2, the tank 1 has a second opening, designated by 5, fixed in a position corresponding to which in a fluid-tight way is the body of a level sensor according to a possible embodiment. The level sensor, designated as a whole by 10, is mounted so as so as to extend according to a level-detection axis, designated by X, preferably substantially vertical but possibly, if need be, inclined with respect to the vertical.

The sensor 10 has a sensing part 11, designed so as to extend at least partially inside the tank 1. The distal end region of the sensing part 11 is preferably in contact with or at a slight distance from the bottom wall 4 of the tank, i.e., at a height very close to that of the opening for outlet or drawing-off of the liquid, in order to be able to detect the presence of an even very low level in the tank. In an embodiment not represented, the distal end region of the sensing part 11 is fixed on the inside of the wall of the tank 1 opposite to the wall provided with the opening 5 where the sensor 10 is installed and fixed, preferably via a quick-release coupling or attachment. Preferably, the proximal end region of the sensing part 11 extends inside the tank 1 up to a height relatively close to the upper wall 3.

In the embodiment illustrated, the body of the sensor 10 has, in its upper part, elements for fixing thereof to the upper wall 2 of the tank. In the example, these means are represented by flange formations with associated screws (not represented). This embodiment must not in any case be understood as limiting, there being also possible different solutions for fixing the body of the sensor 10, some of which are exemplified hereinafter.

Figure 2:
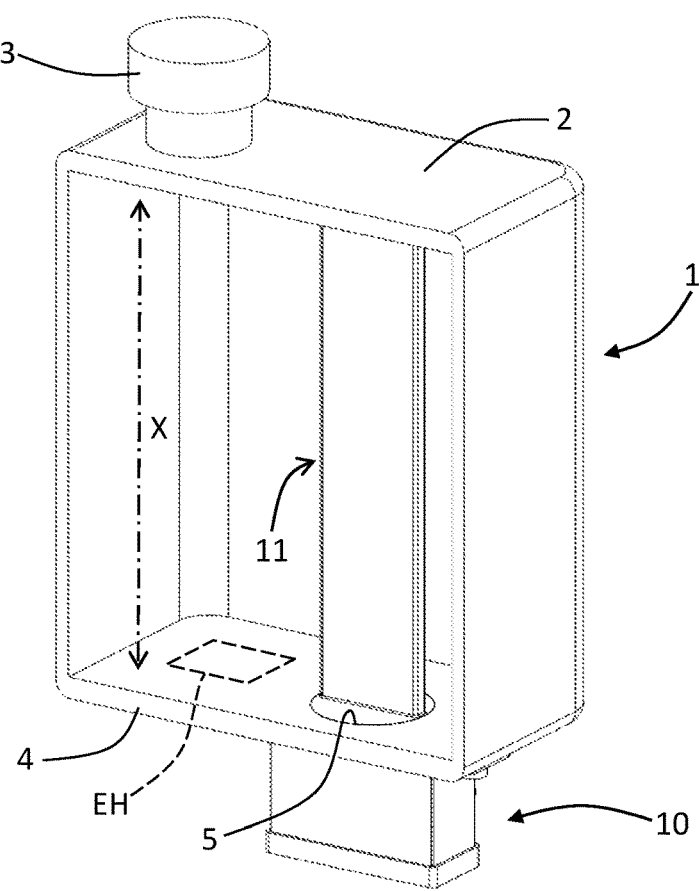

In the example of FIG. 1, the sensor 10 is fixed from above, i.e., associated to the upper wall 2 of the tank. In other embodiments, however, the sensor may be fixed from beneath, i.e., to the bottom wall 4. An embodiment of this type is illustrated schematically in FIG. 2, where the sensor 10 is mounted in a fluid-tight way in a position corresponding to the opening 5, here defined in the bottom wall 4. Also in this embodiment, a proximal end region (which here may be defined as lower) of the sensing part 11 is in a position close to the bottom wall 4, whereas the distal end region (which here may be defined as upper) is at a height relatively close to the upper wall 3. Also in a solution of this type, the distal end of the part 11 may be fixed to the wall 3 via suitable coupling means of the type indicated above.

Figure 3:
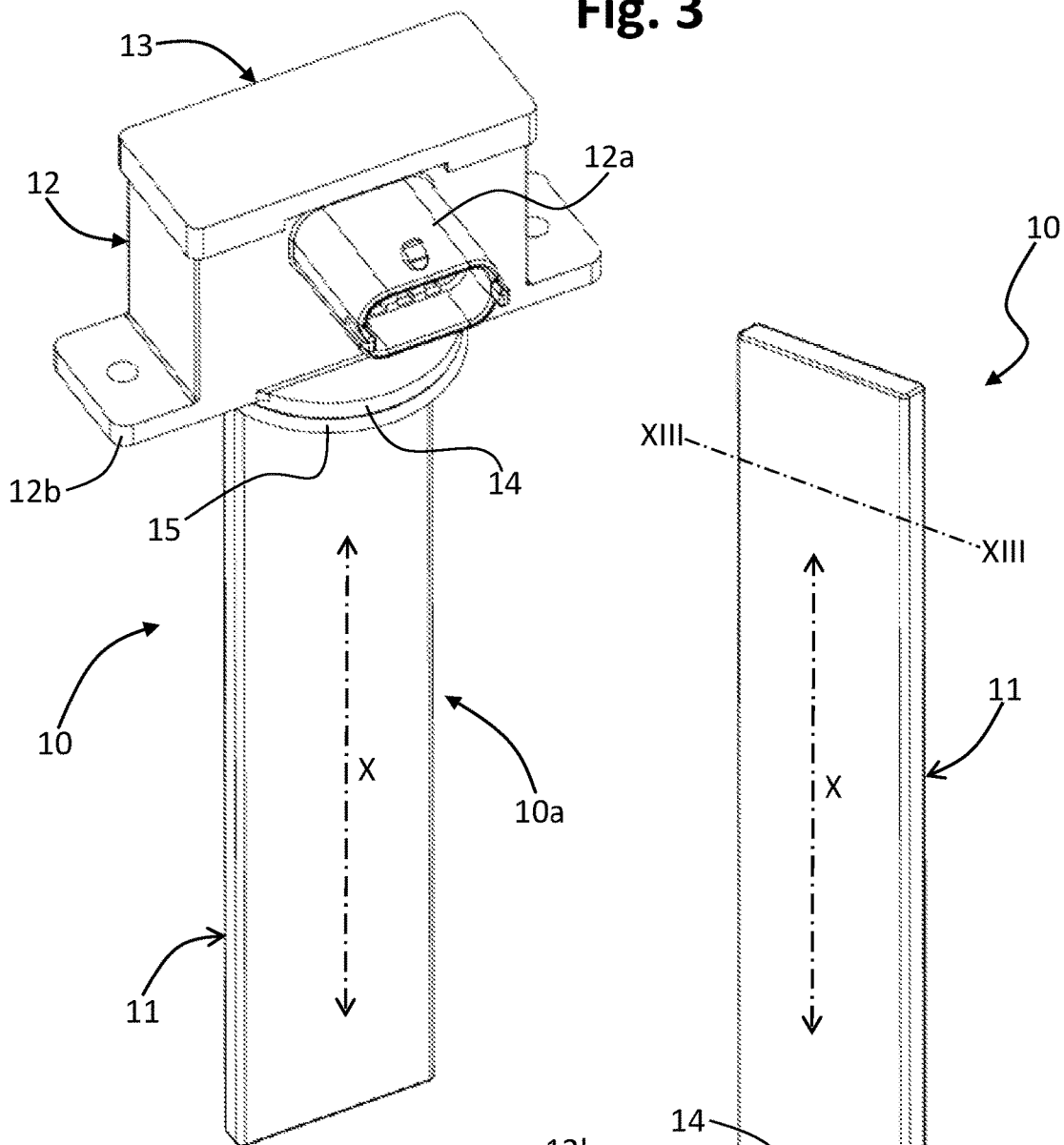
FIGS. 3 and 4 are schematic perspective views, from different angles, of a level sensor according to one embodiment of the invention.
Figure 4:
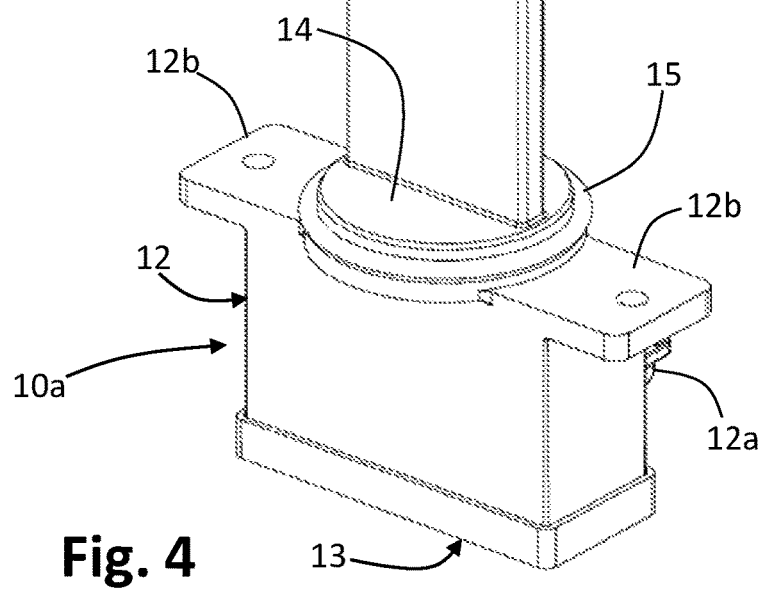

In FIGS. 3 and 4, a sensor 10 according to one embodiment is represented in isolation, from different angles. At the proximal end of the part 11, the body 10a of the sensor 10 defines a box-like housing 12, which also includes a generally hollow connector body 12a, provided with electrical terminals described hereinafter, which preferably projects from a side wall of the housing. The housing 12 is preferably provided with a closing lid 13, which can be secured in position in a fluid-tight way, for example via a welding between the plastic material of the housing 12 and the plastic material of the lid 13.

Between the housing 12 and the part 11 the body 10a of the sensor 10 preferably defines a portion or formation 14 for fluid-tight coupling in a position corresponding to the respective installation opening on the tank. The formation 14 defines at least one seat for at least one sealing element 15, which may also fulfill functions of elastic mounting of the sensor 20 on the tank. In one embodiment, at least two elastic elements of an O-ring type are provided, one of which fulfills sealing functions and the other is exploited to obtain elastic mounting of the sensor 10 on the tank 1, for example in order to compensate for assembly tolerances. In the example illustrated, the formation 14 has a substantially circular profile, and the sealing element is an O-ring. Designated then by 12b in FIGS. 3 and 4 are the aforementioned flange formations for fixing the body 10a of the sensor, which are here defined on the bottom of the housing 12.

Figure 5:
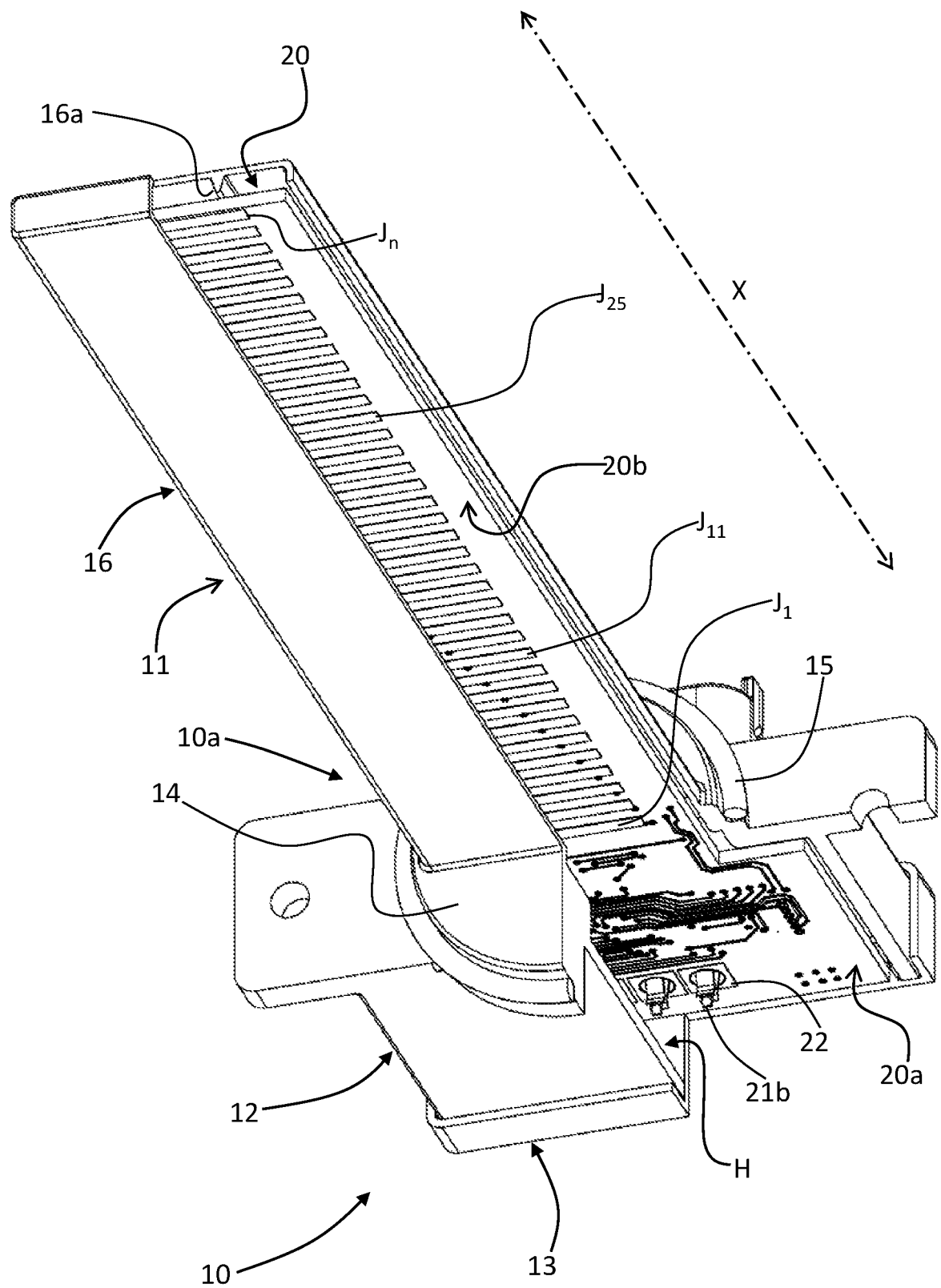
FIG. 5 is a partially sectioned schematic perspective view of a level sensor according to a possible embodiment of the invention.

In FIG. 5, a sensor 10 according to one embodiment is represented partially sectioned in order to highlight how its body 10a is internally hollow in order to house the level-detection components. From the figure is may be noted in particular how the body 10a of the sensor defines, in a position corresponding to the sensing part 11, a hollow casing 16, having a generally elongated shape. In the example illustrated, the casing 16 has a generally prismatic shape, in particular substantially parallelepipedal. As will be seen, in a variant embodiment, at least the casing 16 may be obtained via a direct over-moulding of electrically insulating plastic material on a circuit substrate, described hereinafter. More in general, the sensor 10 has at least one insulation layer, for insulating electrically its electrodes (described hereinafter) with respect to the inside of the tank 1.

Figure 6:
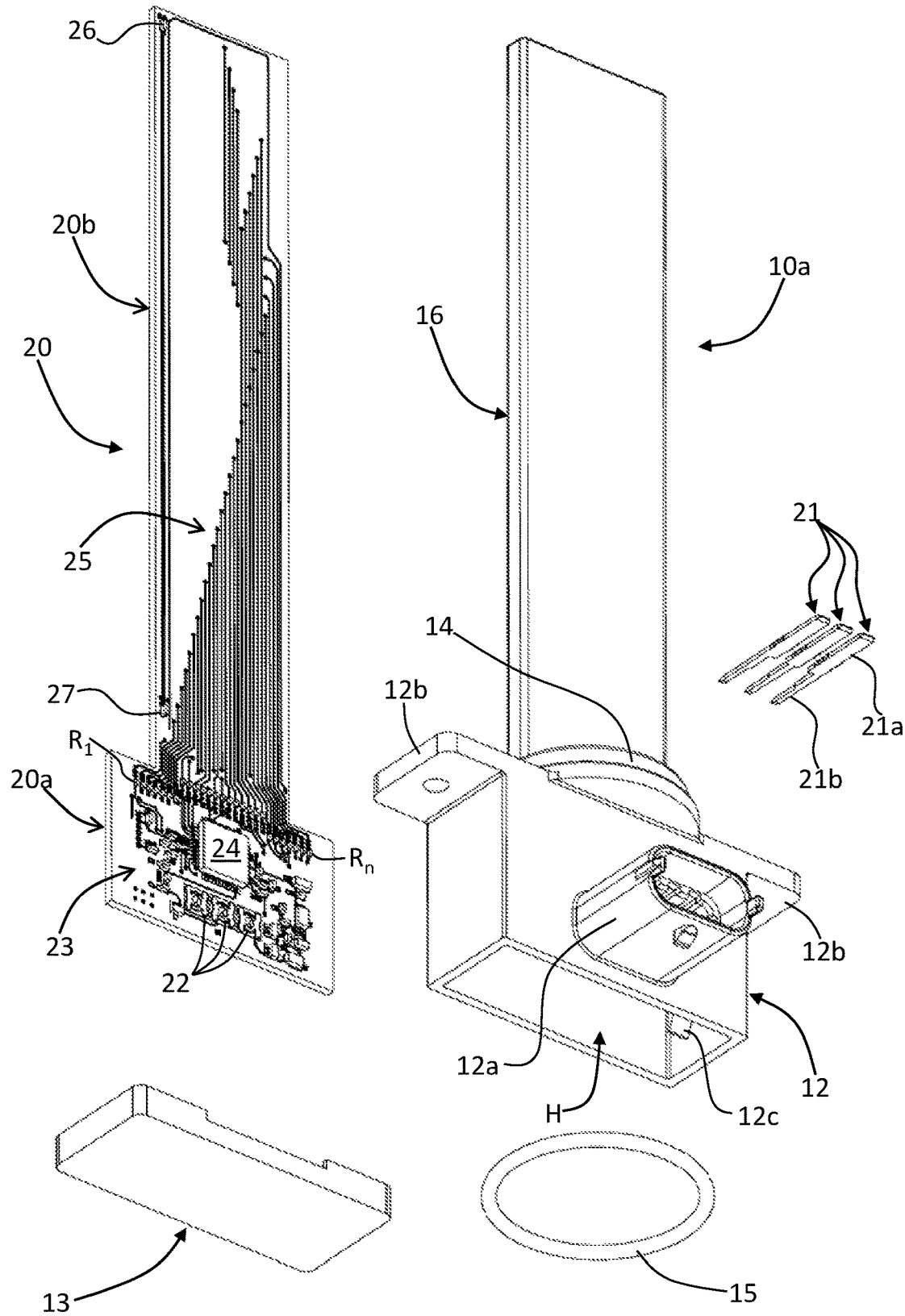
FIG. 6 is a partial exploded schematic view of a level sensor according to a possible embodiment of the invention.

In a preferred embodiment, the housing 12 with the formation 14 and the casing 16 are defined by a single body 10a made of electrically insulating plastic material, as may be clearly seen, for example, in FIG. 6. Not excluded, on the other hand, from the invention is an embodiment of the body 10a in distinct parts rendered fixed with respect to one another in a fluid-tight way, for example via mutual-coupling means, or else via welding or overmoulding.

In one embodiment, the body 10a, or at least its portion designed for being directly or indirectly exposed to the liquid (the casing 16 and possibly the attachment portion 14) is made of a mouldable thermoplastic material, such as polypropylene (PP), or of a high-density polyethylene (HDPE). Practical tests conducted by the present applicant have, on the other hand, made it possible to ascertain that a particularly suitable material—also in view of the particular level-detection modalities described hereinafter—is a cyclic-olefin copolymer (COC). Materials of this type, usually employed in the medical field, present particularly advantageous characteristics for the application considered herein, amongst which there may be cited low density, very low water absorption, excellent barrier properties in regard to water vapour, high stiffness, strength, and hardness, high resistance to extreme temperatures and thermal shocks, excellent resistance to aggressive agents such as acids and alkali, excellent electrical-insulation properties, and easy workability using ordinary methods of treatment of thermoplastic materials, such as injection moulding, extrusion, blow moulding, injection blow moulding.

The material, or at least one of the materials used for providing the body 10a of the sensor 10, may be similar to or chemically compatible with a material that provides at least part of the tank 1, for example in order to enable a fluid-tight welding between the body of the sensor and the tank. One or more of the materials indicated above may be used to provide different portions of the body 10a, such as the housing 12 with the formation 14 and the casing 16, even when the body 10a is made of distinct pieces rendered fixed with respect to one another. Of course, also the lid 13 may be obtained with one of the materials indicated.

Once again in FIG. 5, it may be noted how housed in the cavity defined by the body of the sensor 10, designated as a whole by H, are the electrical and electronic detection components. In a preferred embodiment, these components are mounted on an electrically insulating substrate 20 that provides a circuit substrate. The substrate 20 is made of a material suitable for creating printed circuits, such as for example FR4 or a similar composite material such as fibreglass, or again a polymer-based ceramic material, preferably a material that can be moulded to enable production of the substrate 20.

In the circuit substrate 20 there may be identified a first portion 20a, that is to be received in the housing 12, and a second portion 20b that is to be received in the casing 16. Associated to the portion 20a of the substrate 20 are prevalently the control electronic components of the sensor 10, as well as corresponding terminals for external electrical connection of the sensor 10. Associated, instead, to the portion 20b of the substrate 20 are the detection components, including a series of electrodes. Some of these electrodes are designated in FIG. 5 by the letter "J" followed by the number that identifies the position of the electrode in the series that extends from the proximal end (electrode $J_1$) to the distal end (electrode $J_n$) of the sensing part 11, i.e., of the portion 20b of the substrate 20.

In the example illustrated, a single circuit substrate is provided defined in which are the parts 20a and 20b, but in possible variant embodiments there may be provided a number of circuit substrates connected together by means of suitable electrical interconnection means and possibly mechanical interconnection means (for example, a circuit substrate corresponding to the portion 20a and a circuit substrate corresponding to the portion 20b, with electrical conductors or connectors for connecting electrically conductive paths of one portion to electrically conductive paths of the other portion).

In FIG. 6 a sensor 10 according to one embodiment of the invention is represented in exploded view, where there may be appreciated the various parts already identified above. Visible in this figure are the aforementioned terminals, designated by 21, preferably having a generally flat shape, for example obtained via moulding and/or blanking from metal strap, which provide, with the connector body 12a fixed with respect to the housing 12, an interface for external connection of the sensor 10, for example, to a control unit of the SCR system on board the vehicle.

In one embodiment, each terminal 21 has a lamina-shaped contact portion 21a, designed for positioning of the connector body 12a inside the cavity and a narrow interconnection portion 21b, designed for electrical and mechanical coupling with respective contacts 22 present on the substrate 20, in particular in its portion 20a, which are described hereinafter.

Once again visible in FIG. 6 is the substrate 20 as a whole, with the corresponding parts 20a and 20b, with associated electrical and electronic components. The substrate 20 is also represented in isolation in FIGS. 7 and 8, which represent opposite views of its major faces. The circuit substrate 20, of a generally elongated and preferably flat shape, has associated on one of its major faces, here defined conventionally as "back", a control circuit arrangement, designated as a whole by 23, preferably comprising an electronic controller 24, for example a microcontroller. The controller 24 preferably comprises at least one processing and/or control logic unit, a memory circuit, and inputs and outputs, among which inputs of an analog/digital type.

The components of the circuit arrangement 23 are connected to electrically conductive paths provided in the portion 20a, which are visible for example in FIG. 8 (without any reference number). On the back of the portion 20b of the substrate there is then provided a series of electrically conductive paths 25, for electrical connection of the electrodes J of FIG. 5—preferably with metallized through holes for connection between paths on different surfaces—and of possible other components to the arrangement 23.

In one embodiment, the circuit comprises at least one temperature sensor, in particular provided on the corresponding circuit substrate 20. Such a sensor, for example of an NTC type, may be mounted on at least one of the distal end region and the proximal end region of the portion 20b of the substrate 20. In the example represented, mounted on the portion 20b of the substrate 20, in particular on its back, are two temperature sensors 26 and 27, in opposite end regions of the portion 20b, connected to the circuit arrangement 23 via corresponding conductive paths. Assuming an installation of the sensor 10 in the tank 1 of the type illustrated in FIG. 2, the temperature sensor 27 may be used for detecting the temperature of the liquid, whereas the sensor 26—which in the installed condition is closer to the upper wall of the tank—may be used for detecting the temperature in the internal volume of the tank above of the liquid, for example the temperature of the air. A configuration of the type represented, in particular with two temperature sensors 26 and 27, enables installation of the sensor 10 in the tank 1 either in the configuration of FIG. 1 or in the configuration of FIG. 2, by inverting, at a software level, the functions, such as the functions of the two sensors and/or the functions of the electrodes J.

A sensor for detecting temperature may be provided within the portion 20a of the substrate, i.e., within the housing 12. It may also of course be possible to provide more than two temperature sensors, for example with one or more sensors in intermediate positions between those of the sensors 26 and 27.

Clearly visible in FIG. 8 is the front of the substrate 20, in the portion 20b of which the electrodes J are arranged, just some of which are shown. In the non-limiting example represented, the electrodes J—which are thirty-seven in number—are arranged according to an array that extends according to the direction of length of the portion 20b of the substrate, i.e., along the detection axis X, spaced apart from one another. The electrodes J are made of electrically conductive material, for example a metal material or a metal alloy, and are associated to the front of the portion 20b of the substrate 20. The electrodes J are preferably coplanar and may, for example, be in the form of plates or laminas etched or applied on the substrate 20, or else constituted by an electrically conductive layer—in a way similar to the paths 25—that is deposited on the substrate 20, for example with silk-screen printing technique or the like.

As has been mentioned, in one embodiment, the substrate 20 has through holes—partially visible in FIGS. 7 and 8, where one is designated by F—containing conductive material for electrical connection between the electrodes J provided on the front of the portion 20b and the conductive paths 25 present on the back of the portion 20b of the substrate 20.

To return to FIG. 6, visible therein is a part of the blind cavity H that extends axially in the body 10a of the level sensor, i.e., in its parts 12, 14, and 16. Within this cavity H there are preferably provided guide and positioning elements for the substrate 20, some of which are partially visible in FIGS. 5 and 6, where they are designated by 16a and 12c, in a position corresponding to the casing 16 and in a position corresponding to the housing 12, respectively. Positioning elements for the substrate 20 may possibly be provided also in the lid 13.

In FIG. 9, the level sensor 10 is visible in a longitudinal section, from which there may clearly be noted the presence of the blind cavity H that extends in the housing 12, in the attachment formation 14, and in the casing 16, in the cavity H there being housed the circuit substrate 20. From this figure, it may clearly be noted how, in one embodiment, the temperature sensor 27 is set in a position close to the formation 14 or, more in general, in an installed condition of the sensor 10, in a position close to the wall of the tank 1 provided with the opening for installation of the sensor 10. From a comparison between FIGS. 7-8, on the one hand, and FIG. 9, on the other, it may moreover be appreciated that also the electrode designated by $J_1$ is, in the installed condition of FIG. 2, in a position close to the bottom wall of the tank, preferably a position that can be reached by the liquid even in a condition of albeit minimal filling of the tank. As will be seen, in one embodiment, the electrode $J_1$ is used for supplying a reference value used in the course of detection of the level of the liquid. According to a different embodiment, the electrode $J_1$ may for this purpose be used in combination with at least one further reference electrode J at a different potential or voltage. On the other hand, one or more reference electrodes J may be provided also in other areas of the portion 20b of the substrate 20.

Also visible in FIG. 9 is the connector body 12a, with one of the corresponding terminals 21. The terminals 21 may be interference fitted in corresponding passages defined in the connector body 12a, or possibly at least the body of the housing 12 may be overmoulded on the terminals. Preferably, the terminals, and the corresponding passages of the connector body, extend longitudinally in a direction substantially perpendicular to a plane identified by the circuit substrate 20 and/or by the electrodes J.

In one embodiment, the contacts 22 are configured for elastic coupling with the terminals 21 in order to obtain electrical and mechanical connection with one another. Visible in FIG. 10, and in even greater detail in FIG. 11, is a possible modality of coupling between the portion 21b of a terminal 21 with a corresponding contact 22 provided in the portion 20a of the substrate.

In the embodiment exemplified (see in particular FIG. 11) the contacts have a plane base 22a provided with a central hole or passage 22b. Departing from the base 22a, on opposite sides of the passage 22b, are at least two tabs 22c converging towards one another. The body of the contacts 22 is made of an electrically conductive material, such as a metal or a metal alloy, for example phosphorous bronze, preferably coated with tin or gold or other material designed to improve electrical contact.

The tabs 22c are inserted in a corresponding through hole 20c defined in the portion 20a of the substrate, and the base 22a is fixed and/or soldered to a surface of the substrate itself or to its conductive paths. Preferably, the hole 20c is surrounded by the electrically conductive material of one of the paths of the layout of the circuit arrangement 23, with the base 22a of the contact 22 that at least partially overlaps the aforesaid conductive material so as to obtain the electrical connection. As visible also in FIG. 11, in the assembled condition, the passage 22b of one contact is substantially aligned with the hole 20c of the substrate 20, with the base 22a set up against a surface of the substrate itself (here the rear surface) and with the tabs 22c that preferably project from the hole 20c on the opposite surface (here the front surface) of the substrate 20.

For the purposes of assembly of the sensor, the substrate 20, already provided with the corresponding electrical and electronic components, is inserted into the cavity H of the body 10a of the sensor 10 from its open part, i.e., from the housing 12. Hence, following upon insertion, the portion 20b of the substrate 20 is prevalently positioned within the casing 16, whereas the portion 20a is positioned within the housing 12. The position of the contacts 22 and of the holes 20c on the substrate 20 is such that, following upon the aforesaid insertion of the substrate 20 into the body 10a, these holes and contacts face the passages inside the connector body 12b. The terminals 21 are then interference fitted into the corresponding passages of the connector body 12a in such a way that the respective interconnection portions 21b penetrate into the holes 22a and 20c of the contacts 22 and of the substrate 20, respectively. The portions 21b of the terminals then penetrate between the tabs 22c, causing elastic divarication thereof, which guarantees an adequate electrical connection and a well-balanced mechanical connection. Preferably, the above elastic electrical connection is also suitable for preventing any possible damage to the substrate 20 and to the corresponding circuit, due for example to possible mechanical stresses during use of the sensor 10, such as vibrations or stresses applied on the terminals 21.

It will be appreciated that assembly of the sensor is very simple and readily automatable, entailing operations in themselves elementary, represented by insertion of the circuit substrate 20 into the cavity H of the body 10a and subsequent drive fitting of the terminals 21 into the corresponding passages of the connector body 12a.

As has been mentioned, in one embodiment, the body 10a of the sensor 10 is provided with positioning and/or guide elements for the substrate 20. The presence of these elements simplifies further assembly of the sensor 10, at the same time guaranteeing a high precision of assembly between the parts and a greater measurement precision. The aforesaid positioning elements may be provided within at least one of the housing 12 and the casing 16, preferably both in the housing and in the casing. As already mentioned, one or more positioning elements may be provided in the lid 13 of the housing 12.

With reference for example to FIGS. 10 and 11, in one embodiment, defined on the inside of each of two opposite side walls of the housing 12 are insertion and positioning guides, designated by 12c, which are generally parallel to one another and between which there may be engaged an edge region of the substrate 20, in particular of its portion 20a. In the example illustrated, the guides 12c are defined in relief on the inner surface of the aforesaid opposite walls of the housing 12 (see in this regard also FIG. 6, in which the top of a guide 12c is visible), but not excluded from the scope of the invention is an embodiment in which guides having purposes similar to those of the guides 12c are constituted by recesses that extend in the longitudinal direction of the body of the sensor 10. Preferably, the top of the guides 12c is shaped so as to have a centring lead-in portion, here defined by an inclined surface, designed to facilitate introduction of the opposite edges of the portion 20a of the substrate in the respective pairs of guides 12c. The portion 20a of the substrate 20 may be inserted with slight interference between the guides 12c or with a minimal play.

From FIG. 10 it may also be appreciated how, in a preferred embodiment, also the lid 13 has, on the inside of its top wall, a positioning formation 13a, defining a seat for the proximal or upper edge (as viewed in the figure) of the portion 20a. Also in this case, preferably, the positioning formation 13a is shaped so as to define a centring lead-in portion, here comprising two converging inclined surfaces, in order to facilitate introduction of the proximal or upper edge of the portion 20a in the corresponding seat when the lid 13 is mounted on the housing 12. The formation 13a preferably comprises a contrast surface or element 13b suitable for preventing undesirable axial movements of the substrate 20.

In a preferred embodiment, defined between the distal end of the casing 16 and the distal end of the substrate 20 (i.e., of its portion 20a) is a free space or clearance, in particular to enable compensation of possible different degrees of thermal expansions of the material that constitutes the casing 16 and of the material that constitutes the substrate 20. Such a clearance is designated by $H_1$ in FIG. 12, which represents an enlarged detail of the sensor of FIG. 9, in particular of the distal end portion of the sensor 10. In order to clarify this aspect, it should be considered that a preferential context of use of the sensor 10, which is the vehicles sector, envisages reaching of very low temperatures, for example as low as −40° C., while the device is, instead, produced substantially at room temperature, for example at 25° C. With reference to this numeric example, the sensor 10 hence undergoes a considerable thermal swing, to which there corresponds variable shrinkage of the casing 16 according to the plastic material used.

On the hypothesis of having the above temperature jump of 65° C. (from +25° C. to −40° C.), the clearance $H_1$ is hence envisaged so as to enable free contraction of the casing 16, without it coming into contact with the distal end or edge of the substrate 20 and/or a clearance $H_1$ is envisaged such as to prevent the above contraction of the casing 16 from possibly damaging one or more electrodes J. With reference to the materials mentioned previously, the following values of thermal expansion may be considered:

HDPE=>200 ppm/° C.
PP=>120 ppm/° C.
COC=>60 ppm/° C.
FR4 (substrate 20)=>20 ppm/° C.

Considering now the formula $H_1$ (mm)=unit h (mm/mm)× length Lu of the sensor (mm), for the temperature jump given here by way of example (65° C.) the following values of unit h may be considered:

h for HDPE=0.012 mm/mm
h for PP=0.007 mm/mm
h for COC=0.003 mm/mm

Consequently, for example for a sensor body 10 with Lu=150 mm made of HDPE, the minimum value of $H_1$ is 0.012×150=1.8 mm; for a sensor body of identical length Lu made of PP, the minimum value of $H_1$ is 0.007×150=1.05 mm; for the same sensor body made of COC, the minimum value of $H_1$ is 0.003×150=0.45 mm.

In a preferred embodiment, the portion 20b of the circuit substrate 20 is positioned within the casing 16 of the body 10a of the level sensor in such a way that its front, i.e., its face provided with the electrodes J, is adjacent to or set up against the corresponding inner surface, preferably at least partially in contact therewith. For this purpose, preferably, inside the casing 16 one or more positioning elements are provided, which tend to urge the portion 20b of the substrate towards a wall of the casing 16. In one embodiment, projecting from the inside of one wall of the casing 16 is at least one aforesaid positioning element, which extends in the direction of the opposite wall of the casing itself.

A possible embodiment in this sense is visible in FIG. 13, which is a cross-sectional view of the casing 16 (in particular according to a plane orthogonal to the axis X, passing for example through the line XIII-XIII of FIG. 4). From this figure it may be noted how projecting from the inside of one of the major walls of the casing 16 are two reliefs 16a (one of which is visible also in FIGS. 5 and 9), which are generally parallel to one another and extend in the longitudinal direction of the casing, preferably but not necessarily throughout its length (these reliefs possibly presenting intermediate interruptions). The reliefs 16a, here defined integrally by the body 10a or by the casing 16, preferably have a tapered profile in such a way that a generally pointed or thinned-out top thereof is pressed against the back of the portion 20b of the substrate 20. As may be appreciated, following upon insertion of the substrate 20 into the cavity H, the reliefs 16a are designed to urge the front of the part 20b against the inner surface of the wall of the casing 16 opposite to that from which the reliefs themselves rise. This stress advantageously has an elastic component, due to a certain elasticity of the plastic material constituting the casing 16.

In one embodiment, the positioning element 16 or each positioning element 16 is made of a material different from that of the casing 16, such as an elastomer, for example mounted or comoulded or overmoulded on the casing 16 and/or have another shape different from the one represented, albeit designed to operate so as to exert thrust and/or operate in an elastic way on the substrate 20 and the electrodes J.

In a preferred embodiment, the relief or reliefs 16a is/are configured so as to be able to yield elastically and/or undergo deformation at least in its/their top area in order to enable insertion of the substrate 20 even in the case where the thickness of the latter is greater than the distance between the tip of the relief or reliefs 16a and the inner surface of the casing 16 facing the above tip (a condition that may arise as a result of dimensional tolerances due to different degrees of shrinkage of the plastic material during the corresponding moulding process), in any case guaranteeing the aforesaid thrust.

In one embodiment, introduced inside the casing 16, or in any case at least of the substrate 20 and the corresponding facing wall of the casing 16a, is a fluid filling material that is not electrically conductive, such as an electrically insulating fluid material, in order to ensure preferably absence of air bubbles—in particular between the electrodes J and the casing 16—that could vitiate proper measurement of the level, which is carried out according to the modalities described hereinafter. The aforesaid filling material, which preferably is designed to encapsulate and/or be in contact with at least the portion 20b of the substrate 20, may for example be a polyurethane resin or, preferably, a gel, very preferably a silicone gel. A silicone gel suitable for the application is, for example, the one called SilGel® 612, marketed by Wacker Chemie AG, Munich, Germany.

The presence of the filling or insulating or gel material, for brevity in what follows also defined only as "gel", has principally the function of filling the possible gaps that arise between the front of the portion 20b of the sensor and the wall of the casing 16 facing it. These gaps, albeit of minimal volume, may exist, for example, on account of the surface roughness of the substrate 20 and/or of the electrodes J, or again when the electrodes J have a thickness that determines a slight projection thereof from the front surface of the portion 20b of the circuit substrate, or again on account of the roughness and/or of possible deformation of the wall of the casing 16, for instance, following upon surface finish of the corresponding mould and/or the different shrinkage of the polymeric and/or thermoplastic material in the case of moulding of the casing 16.

The ideas set forth above are further clarified by the details represented in FIGS. 14 and 15. Clearly visible in the detail of FIG. 14 is the top of a relief 16, which presses on the back of the portion 20*b* of the substrate, thereby pushing the electrodes one—of which is designated by J—against the inner surface of the facing wall of the casing 16. The further enlargement of FIG. 15 highlights the interface area between the electrode J and the aforesaid wall of the casing 16, from which it may be noted how, in the case exemplified, the facing surfaces of the two elements in question have respective micro-cavities, for example due to surface roughness and/or deformations of materials (for example, different shrinkage of the material during moulding, slight warping, etc.). In the presence of the aforesaid gel—designated by G in FIG. 15 at the interface between the aforesaid micro-cavities—the reliefs 16*a* urge the part 20*b* of the substrate 20 against the inner surface of the casing 16, thereby favouring exit of the excess gel between the two parts in question. In this way, between these facing parts there remains only a film of gel G strictly necessary to fill the aforesaid micro-cavities. The aforementioned exit of the excess gel G is preferably allowed by the presence of at least one outlet chamber in the casing 16, for example comprising the part of the cavity H internal to the casing 16 that is not occupied by the substrate 20 and by the reliefs 16*a*. This chamber is designated schematically by $H_2$ in FIG. 13 (the chamber $H_2$ may possibly comprise the space previously designated by $H_1$).

From FIG. 14 there may also be appreciated a deformation or slight removal of material from the top of the relief 16*a*, which in the example assumes precisely a nominally rounded tip. As has been explained, the tapered shape of the reliefs 16*a* is aimed at enabling a deformation, in particular in the case where the portion 20*b* of the circuit substrate is force fitted in the cavity of the casing 16 (for example, in the case of excessive dimensional shrinkage or tolerances due to moulding of the casing itself), and at guaranteeing both the aforementioned thrust aimed at obtaining a good contact between the electrodes J and the inner surface of the casing 16 and to cause outflow of the excess gel, for the purposes of a reliable and precise detection. In this regard, it should be considered that, in the preferred embodiment, the gel is introduced into the cavity of the casing 16 so as to substantially fill it, but for practical purposes it is sufficient for the gel to be present in the interface area between the portion 20*b* of the substrate with the electrodes J and the facing surface of the casing 16, where the excess gel can, as has been said, flow out into the aforesaid outlet chamber $H_2$ inside the casing.

Figure 16:
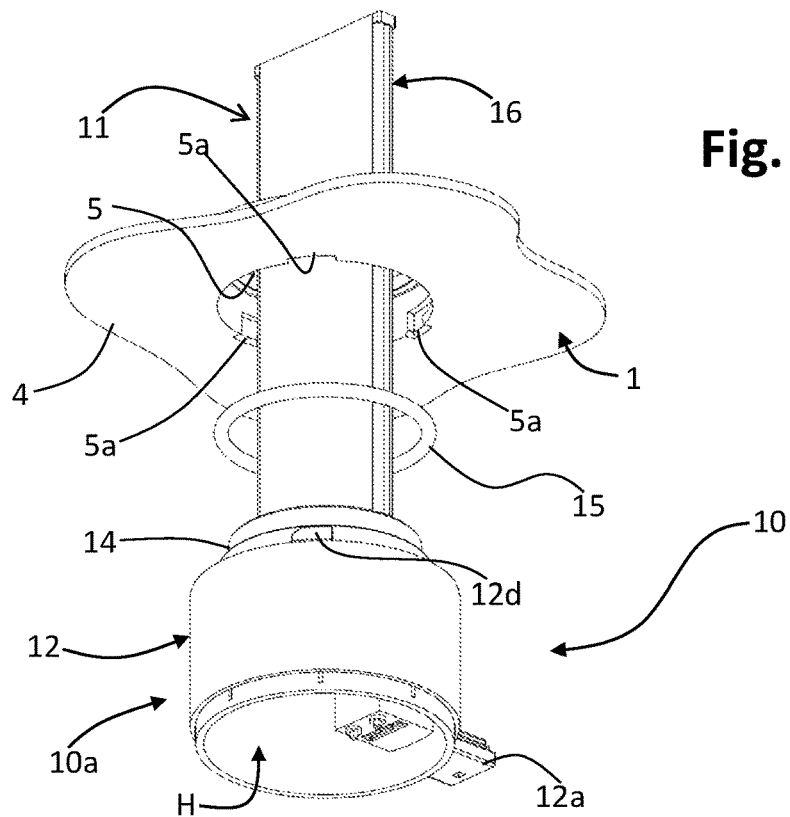
FIGS. 16, 17, and 18 are partial and schematic perspective views of possible alternative configurations of installation or fixing of a level sensor according to a possible embodiment of the invention.

As already mentioned, the modalities of fixing of the body 10*a* of the level sensor 10 to the tank may differ from the ones exemplified previously. In general, the coupling may be based upon the presence of elements in relief associated to one of the body 10*a* of the sensor 10 and the tank 1, which are provided for coupling with cavities or seats present on the other of the tank and the body 10*a* of the sensor, coupling preferably occurring following upon a movement that is in part axial and in part angular. In one embodiment, the mechanical coupling between the body 10*a* and the tank is a fast coupling, for example a fast-block coupling or a threaded coupling or a quick-release coupling. FIG. 16 exemplifies the case of a coupling between the sensor 10 and the tank 1 based upon of a coupling system substantially of a bayonet type. In this example, the body 10*a* of the sensor is provided, in its attachment portion 14, with a plurality of surface engagement teeth or reliefs, just one of which is visible, designated by 12*d*, which are designed for coupling in respective engagement seats 5*a* defined in peripheral positions with respect to the opening 5 of the wall of the tank 1 provided with the opening 5, here the bottom wall 4. Preferably, the aforesaid wall of the tank 1 has, in a position corresponding to the opening 5, a cylindrical housing for receiving the attachment portion 14 and the corresponding gasket 15, with the seats 5*a* that extend between the upper face of the wall 4 and the cylindrical surface of the aforesaid housing. For the purposes of coupling, the body 10*a* is inserted through the opening 5, until the gasket 15 bears upon a corresponding contrast surface defined in the aforesaid cylindrical housing, in which also the attachment portion is received. This insertion is made in such a way that the reliefs 12*d* start to enter a substantially vertical stretch of the respective seats 5*a*. A subsequent angular movement imparted on the body 10*a* determines passage of the reliefs 12*d* in the substantially horizontal stretch of the seats 5*a*, with consequent engagement between the parts, as typically occurs in bayonet couplings of a known type (there being in any case possibly envisaged also inclined stretches in the seats 5*a*).

In one embodiment, in addition or as an alternative, a coupling inside the tank is provided, such as a coupling based upon engagement reliefs associated to one of the distal end of the sensor 10 and the facing wall of the tank, these engagement reliefs coupling with cavities present on the other of the aforesaid distal end and wall. For example, the distal end of the casing 16 may be provided with one or more engagement reliefs or teeth, preferably radial reliefs, designed for coupling in respective engagement seats defined in an element that rises from the wall of the tank facing the aforesaid distal end. The above coupling inside the tank may envisage elements technically equivalent to those described with reference to the example of FIG. 16.

A coupling of the type illustrated in FIG. 16, in addition to not requiring specific tools, makes it possible to obtain elastic mounting of the body 10*a* of the sensor 10 on the tank 1. In the embodiment represented in FIG. 16, the shape of the housing 12 is substantially cylindrical, without prejudice to the characteristics thereof described previously.

In one embodiment, fixing between the body 10*a* of the level sensor and the tank 1 is of a permanent type, for example, obtained via gluing or welding. A solution of this type is exemplified in FIG. 17, where rising on the outside of the wall 4 of the tank 1 (but it could be the wall 2) is an annular relief 2*a*, here a substantially quadrangular relief, which circumscribes a region of the wall 4 in which the opening 5 is defined, here consisting substantially of a slit having dimensions of cross section slightly greater than those of the casing 16. In this case, the attachment portion 14 of the body 10*a* has a shape substantially complementary to the closed profile defined by the relief 2*a*, i.e., quadrangular in the example illustrated, and is preferably provided with an annular relief of its own, complementary or specular to the relief 2*a*, not represented. For the purposes of coupling, the casing 16 of the body 10*a* is inserted into the opening 5, until the attachment portion 14 couples with the relief 2*a*. Definitive fixing between the portion 14 and the relief 2*a* may be obtained via an adhesive deposited on at least one of the two parts in question (where this adhesive also performs the function of ensuring fluid tightness) or else by welding together the portion 14 and the relief 2*a*, for example via laser or vibration or ultrasound welding, or again by remelting of material or the so-called hot-blade welding. Of course, in this case, the materials constituting the wall 2 or 4 of the tank 1 and the attachment portion 14 of the body of the sensor are materials that are compatible in view of the fact that they are to be welded together.

Figure 17:
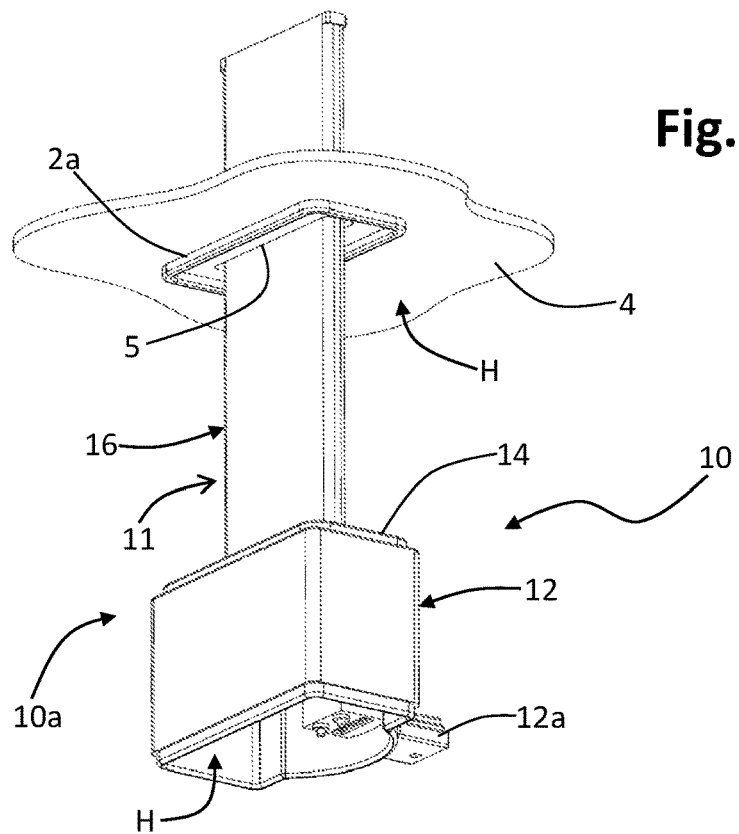

In the embodiment represented in FIG. 17, the wall of the housing 12 from which the connector body 12a projects and the connector body itself have a structure different from the cases illustrated previously, without prejudice to the characteristics of the device described with reference to FIGS. 1-15. In FIGS. 16 and 17, also the connection between the terminals internal to the connector body 12a and the internal circuit of the sensor 10 is different from the one previously exemplified. According to these variants, electrical connectors are preferably provided, equipped with a connector body 12a shaped so as to define keying means, designed to enable unique coupling with a respective external electrical connector, and/or constraining means, designed to enable coupling with the aforesaid external connector only in the right direction, thereby preventing reversals of polarity or erroneous connections.

Figure 18:
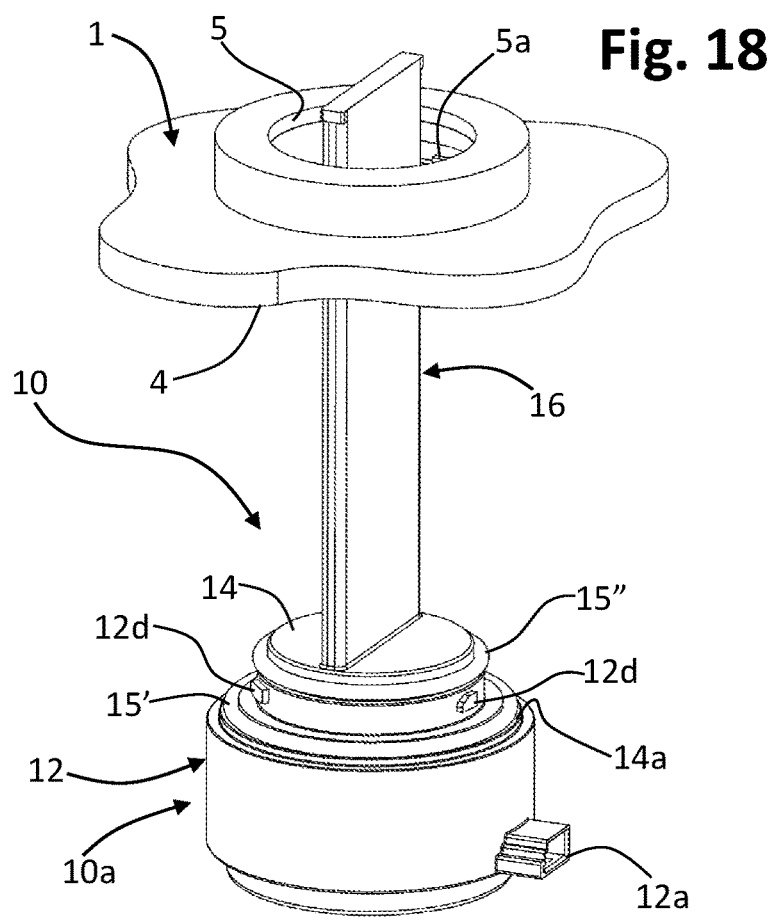
Figure 19:
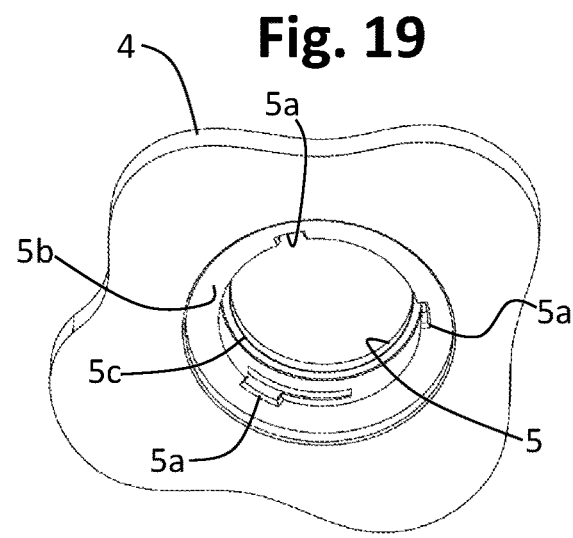
FIG. 19 is a partial and schematic perspective view of a portion of a container to which a level sensor according to FIG. 18 can be associated.

FIG. 18 illustrates a variant embodiment similar to that of FIG. 16, but distinguished by the presence of two elastic elements 15' and 15", here represented by O-rings, with the attachment portion 14 that defines corresponding seats for these elements. Preferably, the surface engagement reliefs 12c are defined in the portion 14 in an intermediate position between the two elastic elements 15' and 15", i.e., in an intermediate position between the corresponding positioning seats. As visible in FIG. 19, in such an embodiment, the cylindrical housing at the installation opening 5 is shaped so as to present two axial resting surfaces 5b and 5c for the elements 15' and 15", respectively, with the engagement seats 5a for the reliefs 12d that are in an intermediate position between the aforesaid surfaces.

In such an embodiment, the lower gasket 15" performs functions of seal, in particular of radial seal, between the portion 14 of the body 10a and the inside of the corresponding cylindrical housing. The elastic element 15' is, instead, designed to be axially compressed between the corresponding resting surface of the portion 14, designated by 14a in FIG. 16, and the surface 5b of the cylindrical housing. In this way, in the installed condition, the elastic reaction of the element 15' urges the body 10a as a whole towards the outside of the housing (downwards, with reference to FIG. 18), thus guaranteeing an elastic mounting and recovery of possible tolerances between the parts involved.

As has been said, the configurations of installation described with reference to FIGS. 16-19 can be used also when the level sensor 10 is associated to the upper wall of the tank, in a way similar to what is illustrated in FIG. 1.

As has been seen, in the embodiments described so far the level sensor 10 includes an array of capacitive elements, each of which includes a single electrode $J_1$-$J_n$ ("n" being equal to 37, in the examples so far illustrated). The word "single" is here meant to indicate that each electrode J belongs to a capacitive element that does not require a further electrode, as typically occurs in known capacitive level sensors, which presuppose the presence of pairs of facing or combfingered (interdigitated) electrodes or plates, or else the presence of a common electrode or plate, facing which are a plurality of electrodes or plates. In other words, in the solution proposed herein each electrode J provides the plate of a sort of "virtual capacitor", the other plate of which is obtained by the medium undergoing measurement present in the tank and in which the wall set in between of the casing 16—or other insulation layer that replaces it—constitutes the dielectric or insulator between the plates of the virtual capacitor, to which there may possibly be added the dielectric or insulator constituted by the layer of gel G described above.

Hence, in practice, each electrode J provides, together with the corresponding control electronics, a sort of capacitive proximity sensor, which is able to detect the presence or absence of the medium even without direct contact with the latter. Such a type of operation is based on the principle of detection of the capacitance of a capacitor. The electrode J is the sensitive side of the capacitor and constitutes a plate thereof, whilst the possible presence in the vicinity of an electrically conductive medium provides the other plate of the capacitor. In this way, the presence or absence of a medium in the proximity of each electrode J determines a capacitance that the control electronics is able to detect.

In the application considered herein each electrode J is hence able to provide at least two different capacitive structures according to whether the liquid is present or absent in front of it, namely, at least:
 a first capacitive structure having a first value of capacitance, when an electrode J is facing the liquid, i.e., when the level of the liquid in the tank corresponds to, or is above, the electrode J considered; and
 a second capacitive structure having a second value of capacitance, when an electrode J is not facing the liquid, i.e., when the level of the liquid in the tank is below the electrode J considered.

In the preferred embodiment illustrated, as has been seen, the electrodes J are isolated with respect to the liquid, in so far as they are contained in the electrically insulating and fluid-tight casing 16: the wall of the casing 16 that the electrodes J face, with the electrically insulating substrate 20 and/or the air and/or the possible layer of gel G set in between, can thus be considered as a sort of dielectric of the aforementioned "virtual capacitor".

In the preferred embodiment illustrated, as has been seen, the electrodes J are isolated with respect to the liquid, in so far as they are contained in the electrically insulating and fluid-tight casing 16: the wall of the casing 16 that the electrodes J face, with the electrically insulating substrate 20 and/or the air and/or the possible layer of gel G set in between, can thus be considered as a sort of dielectric.

The thickness of the wall of the casing 16 facing the electrodes J, i.e., of the insulation layer, may be indicatively comprised between 0.1 and 5 mm, preferably between 0.6 and 1 mm, very preferably approximately 0.8 mm. As already mentioned, moreover, the hollow casing 16 may be replaced by a direct overmoulding of plastic material on the sensitive element or by a generic wall or insulation layer of the electrodes J, with a thickness of the part facing the electrodes J similar to the one indicated for the homologous wall of the casing 16.

Each electrode J is electrically connected—by itself or else in common, in particular in parallel, with at least another electrode J, as explained hereinafter—to a respective input of a plurality of inputs of the controller 24 that belongs to the circuit arrangement 23. Preferably, provided between each input of the controller and a corresponding electrode J is a filter resistance (two of these resistances are designated by $R_1$ and $R_n$ in FIGS. 6 and 7). The controller 24 is substantially pre-arranged for discriminating the value of capacitance associated to each electrode J at least between the aforesaid first and second values of capacitance and consequently identifying at least one liquid/air transition in the tank, which is indicative of the level of the medium when this is in the fluid state. In a preferred embodiment, the controller 24 carries out a sequential sampling of the values of capacitance present at the inputs to which the electrodes J are connected in order to identify the aforesaid transition.

The controller 24 is preferably a digital electronic microcontroller provided with an analog-to-digital converter. Merely way of example, a commercial microcontroller suitable for the application proposed herein is the one identified by the code PIC16F1517 marketed by Microchip Technology Inc., Chandler, Ariz., U.S.A. It should in any case be noted that the functions of the controller 24 may be at least in part implemented via dedicated external circuits. For example, in a preferred embodiment, the controller 24 is constituted by a microcontroller that implements an analog-to-digital converter module, but in other embodiments the controller 24 may include a microcontroller (or a microprocessor or an ASIC or an FPGA) and an integrated (or external or independent) circuit dedicated for performing analog-to-digital converter functions.

Figure 20:
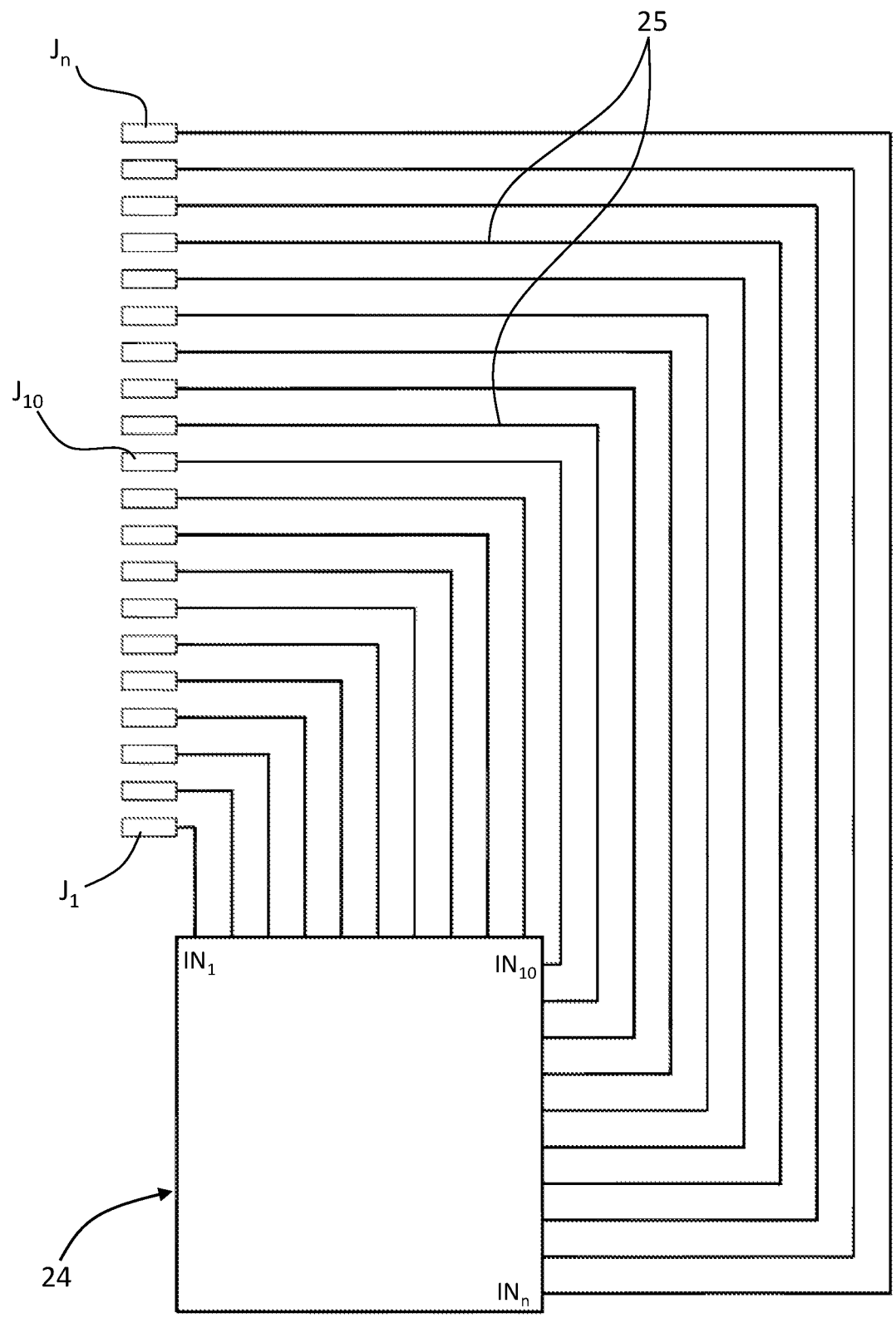
FIG. 20 is a partial and schematic representation aimed at illustrating a possible configuration of connection of electrodes of a level sensor according to a possible embodiment of the invention.

FIG. 20 shows schematically a controller 24 that, merely by way of example, includes "n" signal inputs IN (herein twenty in number), connected to which, via corresponding conductive paths 25, are as many electrodes J in single configuration (i.e., not connected in common or in parallel to other electrodes).

In a preferred embodiment, detection of the value of capacitance at each of the inputs IN is made in an indirect way, for example on the basis of the measurement of a voltage or else by converting an input capacitance into an equivalent resistance and then converting the current measured via the equivalent resistance into a digital count. In these cases, preferably, the inputs IN of the controller 24 are analog inputs, and the controller implements or has associated an analog-to-digital converter.

In a preferred embodiment, associated to each input IN is a sampling or measuring circuit including a controllable switch and a capacitor, which are here also referred to as "sampling switch" and "holding capacitor". The controllable switch is switchable between a first position, in which the holding capacitor is connected to a voltage source, and a second position, in which the capacitor itself is connected to a respective electrode J or to a number of electrodes J connected in common (in parallel). Preferably, the above voltage is a d.c. voltage, for example the supply voltage of the circuit arrangement 23. The controller 24 comprises or has associated means for bringing about switching of the controllable switch from the first position to the second position, so as to discharge the holding capacitor in a way proportional to the value of capacitance associated to the corresponding electrode J or set of electrodes J connected in common. In addition, the controller 24 has means for determining the voltage at the input IN when the controllable switch is in its second position, this voltage being indicative of the capacitance associated to the electrode J or the set of electrodes J. The controller 24 then has control or comparator means, for comparing the voltage determined present at the input IN with at least one corresponding reference value or threshold, and thereby deducing whether the liquid is facing or is not facing the electrode J or else at least one of the electrodes of the set of electrodes J connected in common.

In a preferred embodiment, scanning or sampling of the inputs IN is obtained using a sample-and-hold circuit associated to an analog-to-digital converter, and the measurement of capacitance of each electrode J or set of electrodes J is carried out as comparison of the measurement made with the intrinsic capacitance of the circuit.

Figure 21:
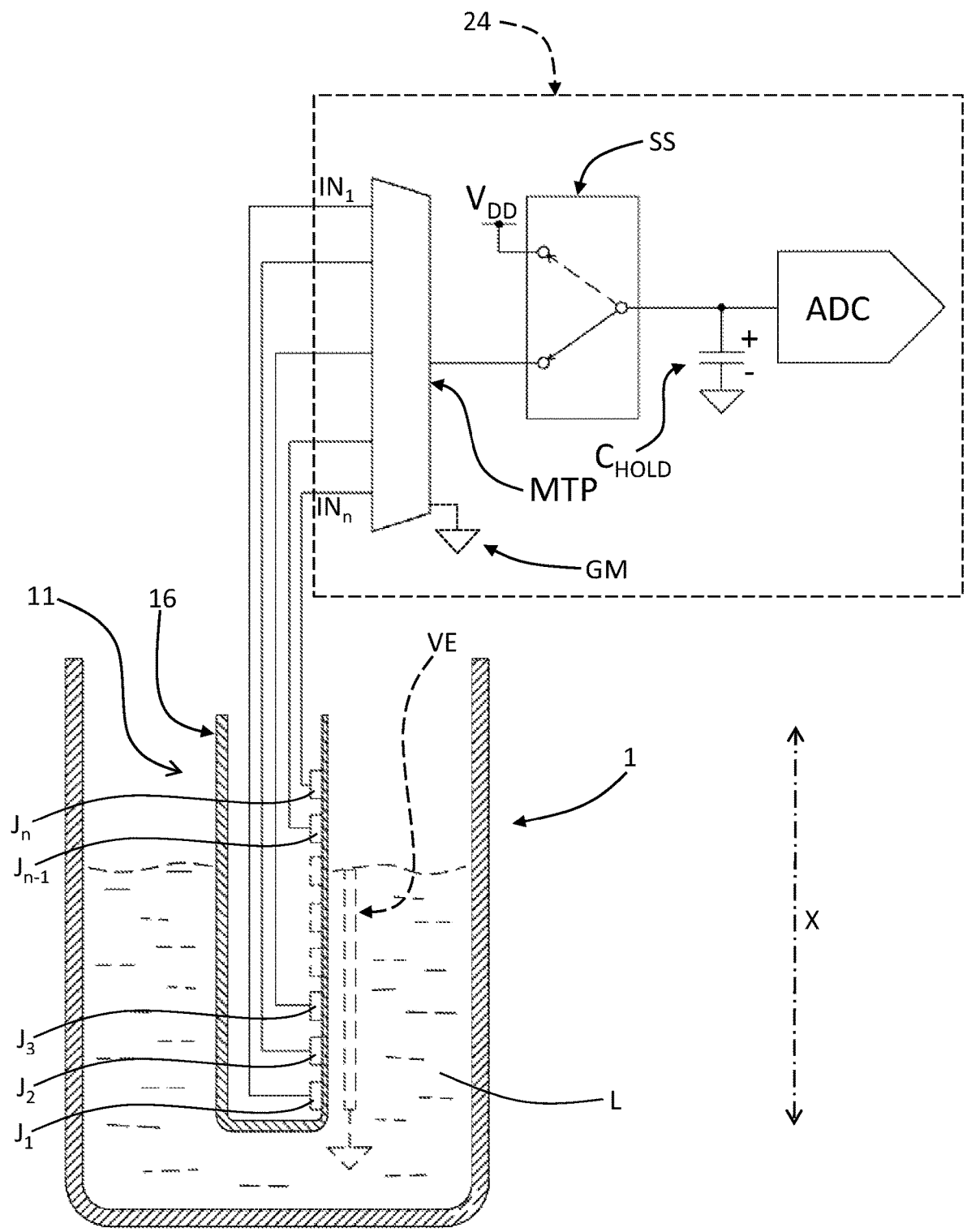
FIG. 21 is a partial and schematic representation aimed at exemplifying a possible circuit configuration of a level sensor according to FIG. 20.

An example of operation of a sensor according to the configuration of FIG. 20—i.e., with electrodes connected singly to respective inputs of the controller 24—is illustrated schematically in FIG. 21. It should be noted that this figure represents, merely for reasons of greater clarity, a level sensor mounted from above, i.e., in the configuration of FIG. 1. The corresponding electrodes J, however, are illustrated in the same order as that of FIG. 20 (hence with the electrode $J_1$ furthest down and the electrode $J_n$ furthest up).

Visible in FIG. 21 is the tank 1, having inside it the sensing part 11 of the sensor, i.e., the electrodes $J_1$-$J_n$, contained in the corresponding casing 16, which is at least partially immersed in the liquid AdBlue, designated by L (the substrate 20 is not here represented for reasons of clarity, and considering that—in a possible embodiment—it could be the casing 16 itself that performs the functions of the substrate 20). In the example illustrated, the analog inputs IN of the controller 24 are connected to a multiplexer MTP implemented in the controller itself, which substantially operates as an electronic deviator, associated to which is a sample-and-hold circuit, here comprising a holding capacitor $C_{HOLD}$ and a sampling switch SS. The sampling switch SS can be switched between a first position, of connection to the voltage $V_{DD}$ (for example, the supply voltage of the controller 24), and a second position, of connection to an output of the multiplexer MTP, i.e., a position of connection to the electrodes J.

In one embodiment, the control circuit arrangement 23 or its controller 24 comprises means for connecting to ground one or more inputs IN, i.e., the corresponding electrodes J, different from the one each time connected to the sample-and-hold circuit. In one implementation, there may be envisaged connection to ground of all the inputs IN (or electrodes J) different from the one each time considered for the purposes of measurement. In the example of FIG. 21, for example, the multiplexer MTP is obtained so as to switch each time each input IN to the sample-and-hold circuit and one or more of the other inputs IN (possibly all) to ground, as represented schematically by the ground symbol GM shown with the dashed line in FIG. 21. In a possible variant embodiment, instead of a connection to ground, at least one input or the inputs IN (i.e., the corresponding electrodes J) different from the one considered for the purposes of measurement may be connected to a different predefined potential, i.e., a different reference voltage, preferably a potential or voltage electrical different from the voltage on the input IN or electrode J each time considered for the purposes of measurement of capacitance (for example, a voltage intermediate between the positive supply voltage and ground or else a negative potential or voltage). In this perspective, the symbol GM in the figures may be understood also as representing a connection to the aforesaid predefined potential.

Via the multiplexer MTP the inputs IN, and hence the electrodes J, are connected sequentially to the sampling switch SS. In the case of the embodiment mentioned just above, when each of the inputs IN is connected by the multiplexer MTP to the switch SS, the multiplexer also connects to ground or to a predefined potential one or more of the other inputs IN, preferably at least the inputs IN corresponding to the electrodes J set adjacent to or in the proximity of the electrode J each time connected to the sample-and-hold circuit.

The sampling switch SS is switched cyclically, in a way synchronized with operation of the multiplexer MTP, between the first position, of charging of the capacitor $C_{HOLD}$, and the second position, of connection of the capacitor itself to the input IN currently selected by the multiplexer MTP, and hence to the corresponding electrode J. With the switch SS in its second position there is basically brought about a charge balance between the capacitance of the capacitor $C_{HOLD}$ and the capacitance associated to the electrode J considered, which here is assumed as being the electrode $J_1$. In other words, with this charge balance, the capacitor $C_{HOLD}$ is discharged in a way proportional to the capacitance of the "virtual capacitor" defined by the electrode $J_1$. Via the ADC the amount of charge, or else a residual voltage of the capacitor $C_{HOLD}$, is thus determined and is then compared with a predefined reference value or threshold in order to deduce whether the electrode J is facing the liquid L or not, i.e., whether the electrode J has assumed the first capacitive structure or configuration or the second capacitive structure or configuration referred to previously.

As explained previously, when an electrode J is facing the liquid L (for example, the electrode $J_1$ of FIG. 21) associated thereto is a first value of capacitance, whereas in the opposite case (as for the electrode $J_n$ or $J_{n-1}$ of FIG. 21) associated thereto is a second value of capacitance, different from the first value. In FIG. 21, the block represented by a dashed line designated by VE is understood as representing schematically the function of "virtual" electrode or plate obtained by the liquid L, as explained above.

Following upon the aforesaid balancing between the charges of the capacitor $C_{HOLD}$ and of the electrode $J_1$, the voltage value across of the capacitor and/or at the input $IN_1$ may substantially coincide or else be higher or lower than a determined reference threshold, previously stored in the controller 24. For example, in one embodiment, the controller 24 may be programmed in such a way that detection at an input IN of a voltage equal to the predefined threshold or higher than this is indicative of the fact that the electrode considered is not facing the liquid L (as for the electrode $J_n$), whereas detection at the input IN of a voltage below the threshold is indicative of the fact that the electrode is facing the liquid (as for the electrode $J_1$).

As may be appreciated, by carrying out the sequential sampling described, the controller 24 is able to identify the two electrodes J corresponding to the liquid/air transition in the tank 1. Once the presence of the liquid/air transition has been detected, the controller can deduce the level of liquid on the basis of the fact that the electrode between the two electrodes J associated to which is the voltage value equal to or above the threshold is the first electrode facing the air (or conversely, the electrode associated to which is the voltage value below the threshold is the last electrode facing the fluid).

For the above purpose, preferably contained in the circuit 24 is information representing values in length (height) corresponding to the position of each electrode J, or in any case the distance between the electrodes J in the direction of the measurement axis X, so as to be able to establish or calculate the level according to the predefined measuring unit. The electronics of the sensor 10 transmits or generates signals to be sent to the outside world and/or to the electrical connector of the sensor 10, which represent the level information.

As has been explained previously, in possible embodiments, for the purposes of detection the multiplexer MPT cyclically connects one input IN to the sample-and-hold circuit and at least some of the other inputs IN (preferably all) to ground or to a certain potential. This proves useful also for reasons of shielding of electromagnetic disturbance and for improving the signal-to-noise ratio. This connection to ground or to a given potential, in particular of some from among the multiple inputs IN or electrodes J, may generate parasitic capacitances in the system, which may, however, be considered negligible with respect to the measurement of capacitance of effective interest, as described previously.

On the other hand, in this case, each electrode J may also provide, together with the corresponding control electronics and at least another electrode J, a sort of capacitive proximity sensor, which is able to detect the presence or absence of the medium even without direct contact with the latter. The two electrodes J come to constitute the sensitive sides of a capacitor, representing the plates thereof, and the medium that separates them (here the material of the portion 20b and/or the gel G and/or the air) represents the dielectric, giving rise to a substantially predefined capacitance. The presence or absence of a further medium in the proximity of the two electrodes J causes a substantially predefined variation or perturbation of the aforesaid capacitance that the control electronics is able to detect. In an implementation of this sort, which prevalently operates on the basis of the field effect, there may exist parasitic components towards the fluid, with an effect similar to what has been described with reference to FIG. 21, which contributes to detection of the capacitance.

Figure 22:
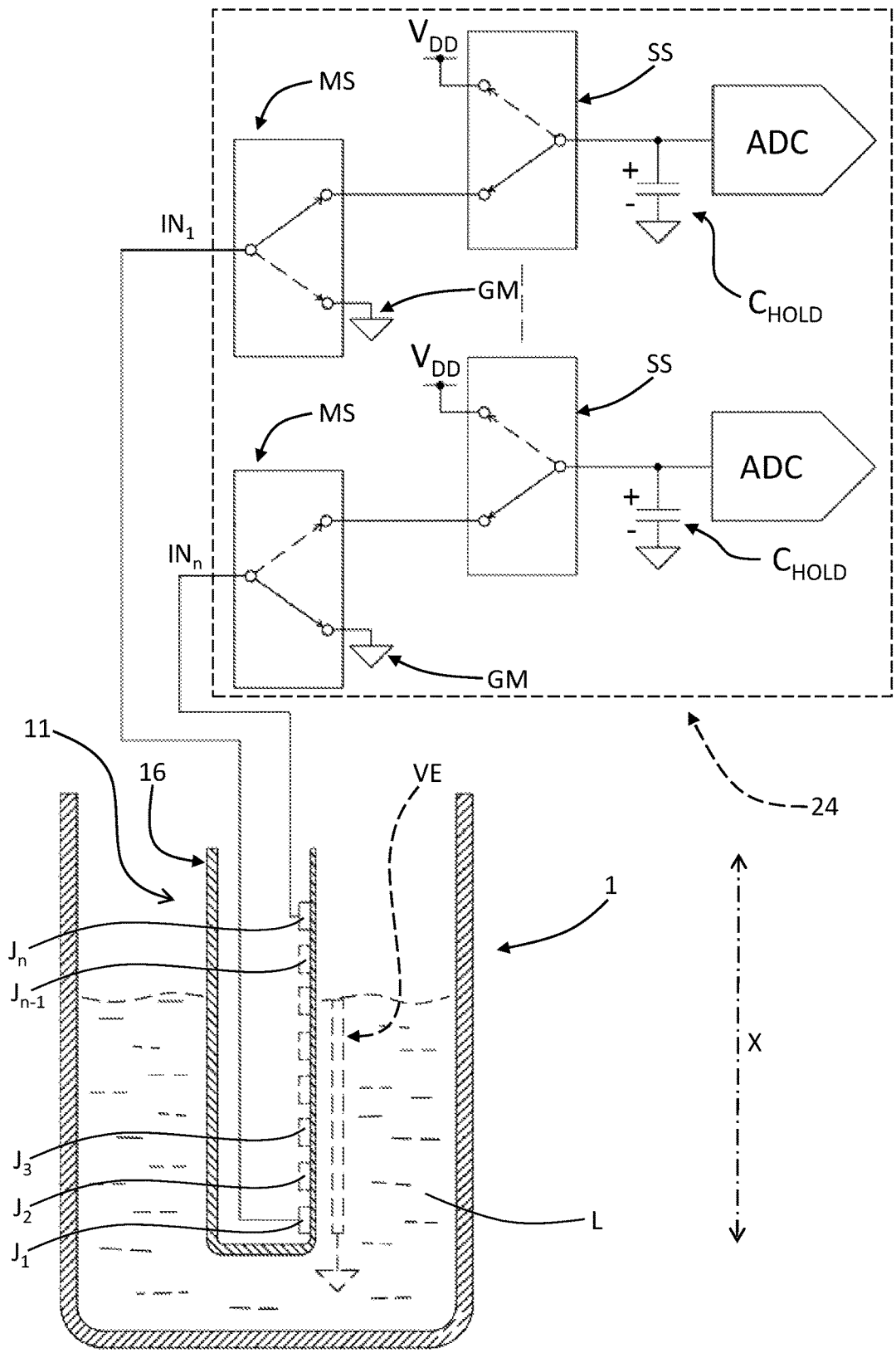
FIG. 22 is a partial and schematic representation similar to that of FIG. 21, aimed at exemplifying an alternative circuit configuration of a level sensor according to FIG. 20.

It will be appreciated that the operations described with reference to FIG. 21 may be obtained also with circuits different from, but technically equivalent to, the one exemplified. For example, to each input IN of the controller 24 there could be associated a respective circuit that performs the functions of the sample-and-hold circuit described above, with a multiplexer MTP between the aforesaid circuits and the ADC. Another possibility is to provide each input IN with a sampling or measuring circuit, which performs, for example, the functions of the sample-and-hold circuit described above, interfaced directly with an ADC. Such a case is, for example, represented schematically in FIG. 22, where the controllable switches designated by MS are switched selectively for connecting each time each input IN to the corresponding sample-and-hold circuit (as for the input $IN_1$) and the other inputs IN are connected to ground or to the aforesaid reference voltage (as for the input $IN_n$) or switched into an open circuit, in which case the voltage or potential on the electrodes J and/or inputs IN may be floating.

The presence of the switches MS may not being necessary in those embodiments in which the inputs IN different from the one being currently sampled are not connected to ground.

Preferably, the electronics of the sensor forming the subject of the invention is appropriately initialized and/or calibrated in the production stage, with storage of the corresponding software or program and/or of at least some of the variables (such as one or more thresholds used in the level detections), which, for example, depend upon the physical configuration of the sensor and of the system on which it is installed, here represented by the tank 1.

In one embodiment, the calibration step includes a reading of all the values of the electrodes J in "dry" conditions or in air (i.e., not facing the liquid) in order to define first reference thresholds and/or define an initial offset zero-setting, namely, to compensate for the parasitic capacitances due to materials, structures, thicknesses, etc. of the sensor and/or of the system on which it is installed. This value is stored as threshold reference for the detections as a maximum voltage threshold that can be detected across the capacitor $C_{HOLD}$ and/or by the ADC circuit, it being possible to vary subsequently this threshold value following upon measurements made in the course of the service life of the sensor, for example by means of a dedicated reference electrode. This calibration threshold is preferably carried out only once on the production line, but, for some applications where the tank presents critical geometries that might affect measurement of the raw data of the electrodes J (such as very restricted volumes and presence of metal material), it is possible to use this calibration or self-calibration directly on the sensor 10 installed so as to have an optimal calibration in the real system and/or eliminate all the possible effects of noise due to the external environment.

The operating principle described to a certain extent depends upon the temperature and aging of the system, if observed in an absolute way. For this reason, in a preferred embodiment, the controller 24 is programmed for carrying out a measurement of a differential type, preferably using for this purpose at least one reference electrode. Given that the effect of the temperature is represented by an offset on the measurement of the voltage value determined at an input IN of the controller 24, by carrying out a differential measurement between a detection electrode and a reference electrode it is possible both to derive the measurement on the detection electrode and to subtract the common-mode effect present on the detection electrodes, and hence to cancel out any possible thermal and/or structural drift produced by the change in temperature and/or by aging. The aforesaid thermal drift may be compensated also via a temperature sensor, for example of the same type as the ones designated by 26 and 27. Hence, according to this embodiment, the voltage value determined, used for the comparison with the at least one reference threshold, is preferably a differential value.

The aforesaid reference electrode is preferably the electrode furthest down inside the tank 1, and hence, with reference to the examples illustrated so far, the electrode $J_1$. It is also possible to provide even a number of reference electrodes (for example, the first three electrodes J starting from the bottom), which can be used for carrying out the differential measurement, as well as to program the controller 24 in order to select each time any one of the electrodes $J_1$-$J_n$ as reference electrode for carrying out the differential measurement (the controller 24 is in fact able to identify an electrode that is facing or is not facing the liquid, on account of the fact that the capacitance in the two conditions is different and on account of the presence of the aforementioned maximum threshold).

In an embodiment of this type, the controller 24 scans all the electrodes J and acquires corresponding raw voltage data for the purposes of verification of the presence of the liquid. In this step, the controller 24 calculates the difference between the raw data of each detection electrode and the raw data of the reference electrode $J_1$, thus obtaining a relative measurement. This difference is compared with at least one minimum threshold defined in the design stage. In a possible embodiment, if at least one of the differences calculated between each detection electrode $J_2$-$J_n$ and the reference electrode $J_1$ is below the minimum threshold, this means that the detection electrode in question is at least partially facing the liquid L; otherwise, the electrode in question is in air, i.e., is at a height higher than the level of the liquid L.

In one embodiment—which envisages connection to ground or to a different voltage of the inputs/electrodes different from the one considered for the purposes of measurement—in order to detect a reference value for the measurement and/or a minimum level a further electrode, not shown, may be provided adjacent to $J_1$, or else the electrode $J_1$ is designed to operate as ground or reference electrode, in which case detection of the reference value and/or of the level will start from the adjacent electrode $J_2$.

As already mentioned, search for the level is substantially based upon identification, by the controller 24, of the two detection electrodes corresponding to the transition between liquid and air. The evaluation is made by comparing the relative information (i.e., the differential measurement) with thresholds predefined for each electrode and defined in the design stage (which may be replaced with thresholds defined and stored following upon testing with liquid in the production stage) in order to deduce whether an electrode is facing the liquid or not. Following upon the scan made, the controller can thus identify two adjacent detection electrodes, one of which is facing the liquid and the other is not, i.e., the position in height of the liquid/air transition in the tank 1.

In an embodiment in itself inventive, the electronic circuit of the sensor 10 undergoes a calibration or configuration on the basis of the type and/or conductivity of the medium of which the level is to be detected, in particular considering that, in the case of slightly conductive, i.e., resistive, media there would be determined also a sort of electrical resistance virtually connected in series to the measurement capacitor, the resistance of which could cause a lengthening of the time necessary for reaching the final threshold value (such as an increase in the charging time of the "virtual capacitor" to which an electrode J belongs and/or an increase in the discharging time of the capacitor $C_{HOLD}$). In this perspective, the aforesaid calibration may, for example, be envisaged in order to take into account possible delays in the sampling measurement, and prevent erroneous measurements on values that have not yet settled completely.

In an embodiment in itself inventive, the electronic circuit of the sensor 10 is configured for detecting the charging curve of the "virtual capacitor" corresponding to the detection electrode J and/or for detecting the discharging curve of a holding capacitor, such as the capacitor $C_{HOLD}$, where the charging curve and/or discharging curve are/is variable at least in proportion to the characteristics of electrical conductivity and/or impedance of the medium undergoing measurement, so as to be able to determine characteristics of the medium itself. The electronic circuit may use the information thus acquired for carrying out one or more from among operations of detection, processing, comparison, storage, compensation, and warning. For this purpose structural and/or circuit elements may be used, which are at least in part similar to the ones described previously.

As has been mentioned, in a particularly advantageous embodiment, the detection electrodes comprise at least first detection electrodes, which are connected to respective inputs IN of the controller 24, and second detection electrodes, which are electrically connected in common or in parallel to the first detection electrodes, the definition of connection in parallel referring also to the connection in parallel between the "virtual capacitors" defined by the electrodes J that are connected together in common with respect to a respective input IN.

Figure 23:
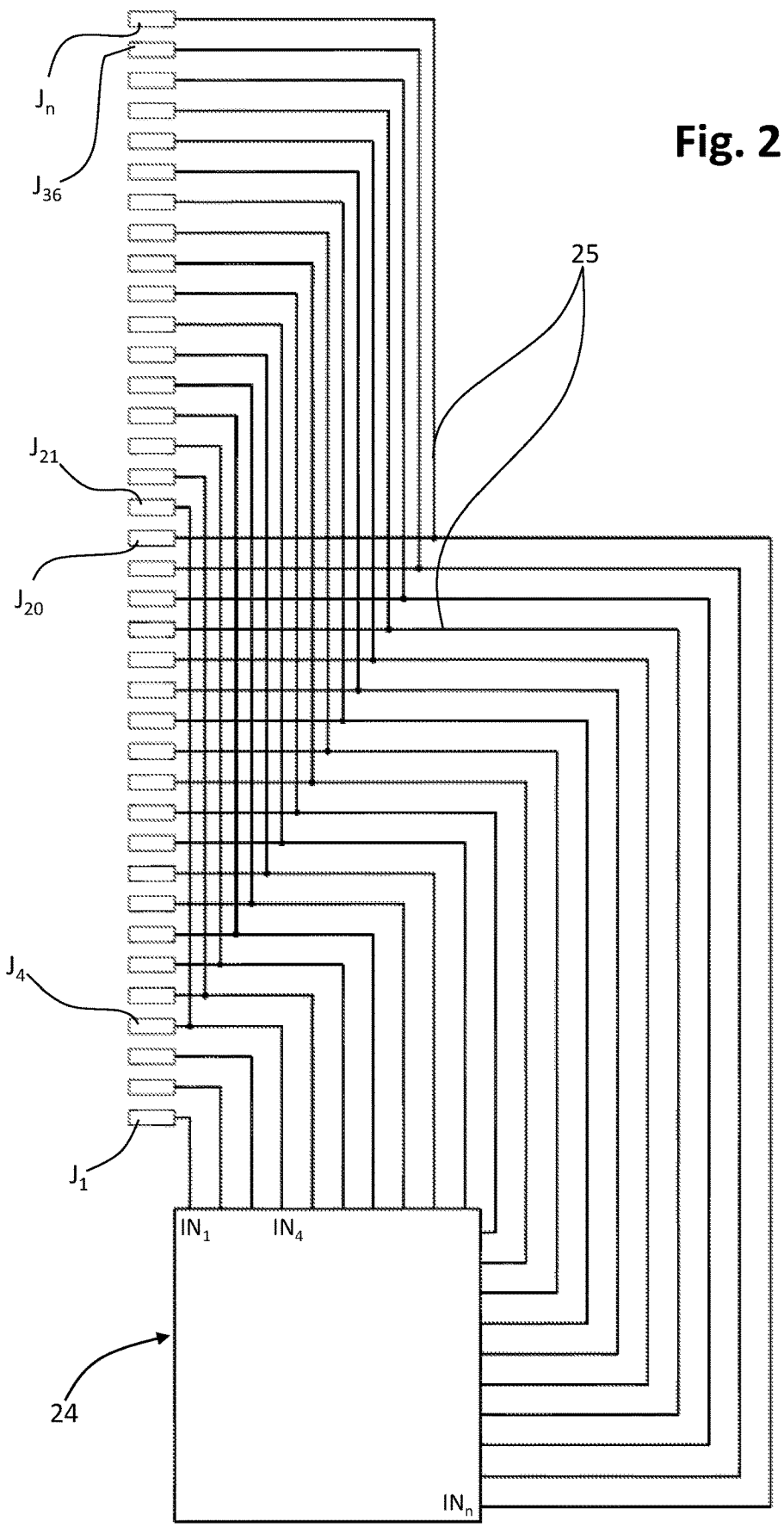
FIGS. 23 and 24 are schematic representations aimed at illustrating further possible configurations of connection of electrodes of level sensors according to possible alternative embodiments of the invention.

An example of this sort is illustrated schematically in FIG. 23, where the aforesaid first electrodes go from the electrode $J_4$ to the electrode $J_{20}$, while the second electrodes go from the electrode $J_{21}$ to the electrode $J_n$. In this example, the electrodes $J_1$-$J_3$ may be reference electrodes. In the configuration of FIG. 23, it is substantially possible to identify a first sub-array (or module or block or set) of first electrodes, which go from the electrode $J_4$ to the electrode $J_{20}$, and a second sub-array of second electrodes, which go from the electrode $J_{21}$ to the electrode $J_n$, which are substantially connected together in common or in parallel. The number of sub-arrays of electrodes may be increased in order to obtain longer or shorter level sensors, i.e., in order to enable different level measurements.

In an embodiment of this type, the aforesaid control or comparator means implemented in the controller 24 are pre-arranged for comparing the voltage determined at the input IN corresponding to two electrodes connected in common (for example, the electrodes $J_4$ and $J_{21}$ in parallel) with at least two corresponding reference thresholds in order to deduce whether the liquid is facing or is not facing the first detection electrode (the electrode $J_4$) and/or to the corresponding second detection electrode (the electrode $J_{21}$). The measurement may be made according to the modalities described previously. Preferably, also in this case, the measurement is made by acquiring the raw datum at the input IN to which the two detection electrodes connected in common are connected, and then referencing this value with respect to a reference electrode, such as the electrode $J_1$, in order to pass from an absolute measurement to a differential measurement so as to eliminate the possible common-mode error effect due to the temperature and/or to aging of the level sensor, as described previously.

In one embodiment, the value obtained from the differential measurement is compared with a number of thresholds equal to the number of electrodes connected in common increased by 1. Consequently, with reference to the example considered here of two electrodes J in parallel, the differential value is compared with three distinct thresholds defined in the design or production stages: a value equal to a first threshold or within a given neighbourhood thereof (for example +/−40%) indicates that both of the electrodes are not facing the liquid, a value equal to a second threshold or within a given neighbourhood thereof (for example +/−40%) indicates that one of the electrodes (known on the basis of its physical position) is facing the liquid and the other electrode is not, and finally a value equal to a third threshold or within a given neighbourhood thereof (for example +/−40%) indicates that both of the electrodes are facing the fluid.

In a different embodiment, a more simplified logic of analysis is provided, whereby the value obtained from the differential measurement is compared with a number of thresholds equal to the number of electrodes connected in common. Consequently, with reference once again to the example considered here of two electrodes J in parallel, the differential value is compared with just two thresholds: a value above a first threshold indicates that both of the electrodes are not facing the liquid, a value between the two thresholds indicates that one of the electrodes (known on the basis of its physical position) is facing the liquid and the other electrode is not, and finally a value below the second threshold indicates that both of the electrodes are facing the fluid.

Of course, on the basis of the same principle described above, there may be envisaged more than two electrodes connected in common, i.e., a number of sub-arrays with the respective electrodes in parallel, in which case the number of reference thresholds for each input IN will be equal to the number of electrodes of each parallel increased by 1 or else equal to the number of electrodes of each parallel, according to the analysis approach implemented.

Figure 24:
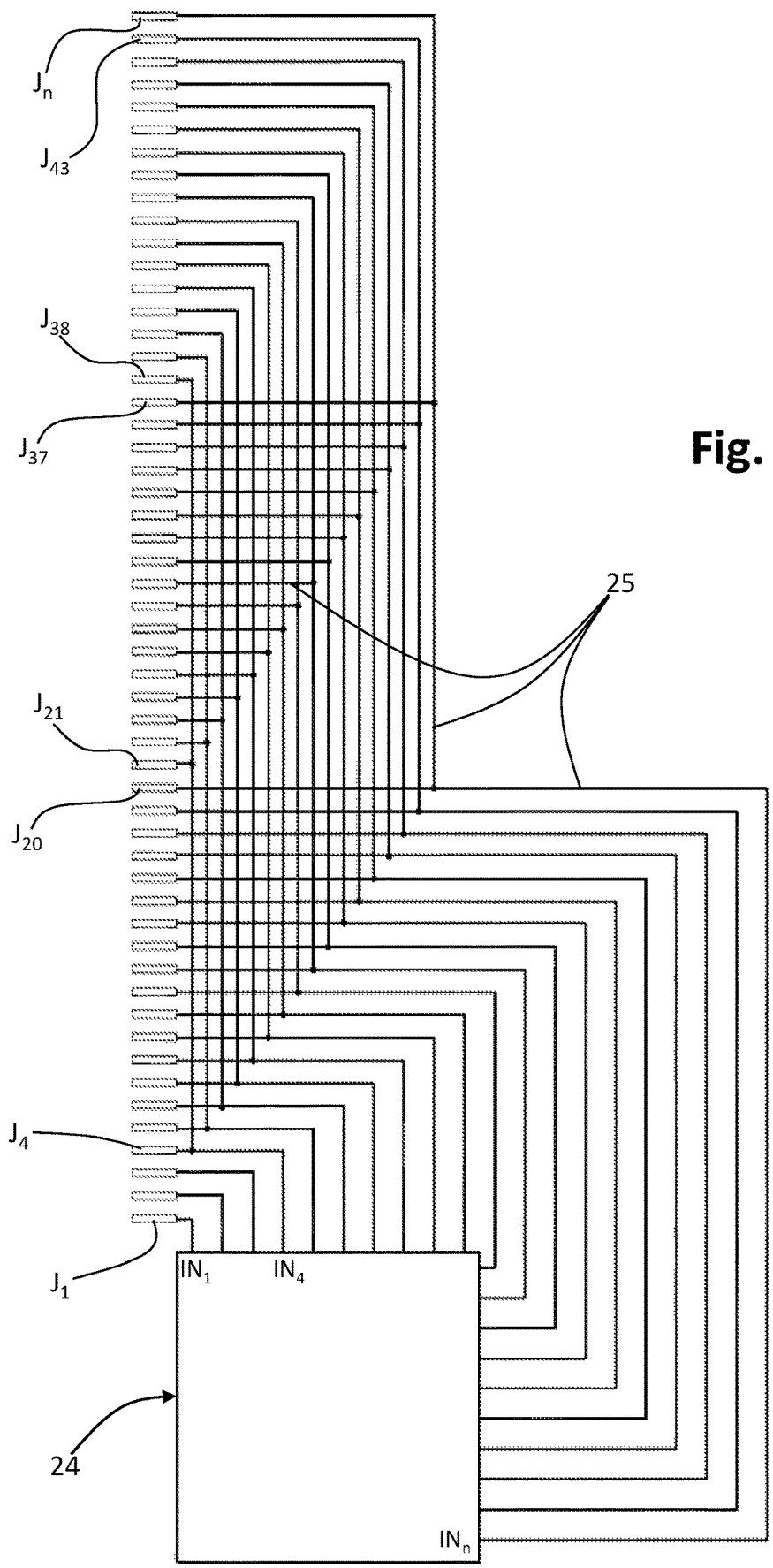

For example, FIG. 24 illustrates the case of first, second, and third detection electrodes connected in common or in parallel. The first electrodes go from the electrode $J_4$ to the electrode $J_{20}$, the second electrodes go from the electrode $J_{21}$ to the electrode $J_{37}$, and the third electrodes go from the electrode $J_{38}$ to the electrode $J_n$. In this example, the electrodes $J_1$-$J_3$ may be reference electrodes. In the example of FIG. 24, it is hence possible to identify three sub-arrays of electrodes or "virtual capacitors", with the electrodes of one sub-array ($J_4$-$J_{20}$) that are substantially connected in common or in parallel with similar electrodes of the other sub-arrays ($J_{21}$-$J_{37}$ and $J_{38}$-$J_n$).

In an embodiment of this type, the control or comparator means implemented in the controller 24 are pre-arranged for comparing the voltage determined at the input IN corresponding to three electrodes in parallel (for example, the electrodes $J_4$, $J_{21}$ and $J_{37}$) with three corresponding reference thresholds in order to deduce whether the liquid is facing or is not facing the first detection electrode (the electrode $J_4$) and/or the corresponding second detection electrode (the electrode $J_{21}$) and/or the third detection electrode (the electrode $J_{37}$). An example of operation of an arrangement of the type illustrated in FIG. 24 is described hereinafter with reference to FIGS. 25 and 26.

Figure 25:
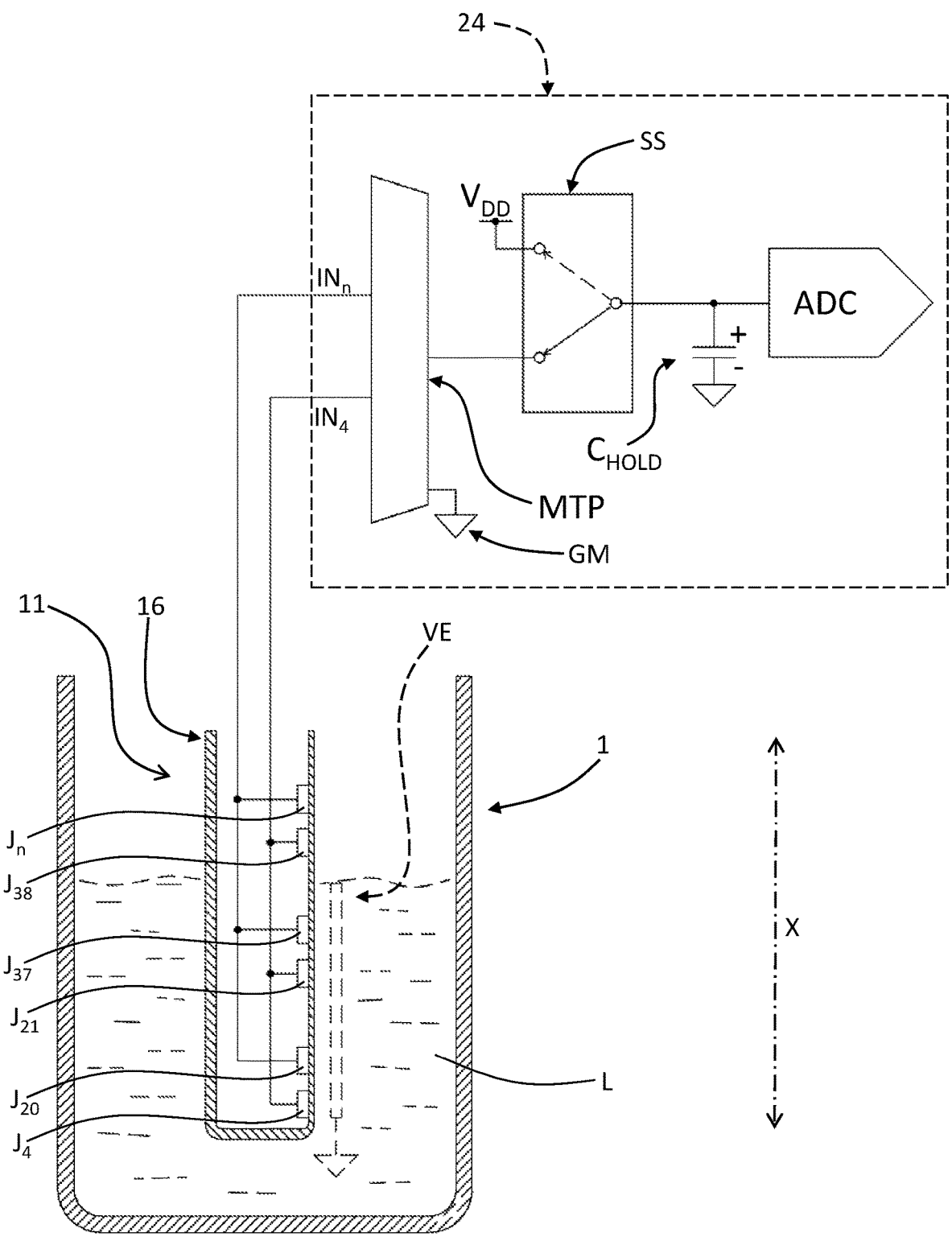
FIG. 25 is a partial and schematic representation aimed at exemplifying a possible circuit configuration of a level sensor according to FIG. 24.

FIG. 25 is a schematic representation similar to that of FIG. 21, highlighted in which are just two inputs $IN_4$ and $IN_n$ of the controller 24 (the representation of the reference electrode $J_1$ is here omitted for reasons of clarity). As for the case of FIG. 21, the controller 24 carries out sequential sampling of its analog inputs IN, with corresponding differential measurement for each of them and corresponding comparison with the three thresholds predefined for electrodes J facing the liquid L and/or with the thresholds predefined for "dry" electrodes J, i.e., ones not facing the liquid L. Also in this case, the control circuit arrangement may comprise means (MS and/or GM and/or MTP) for connecting to ground or to a different predefined potential one or more inputs IN different from the one each time connected to the sample-and-hold circuit.

Figure 26:
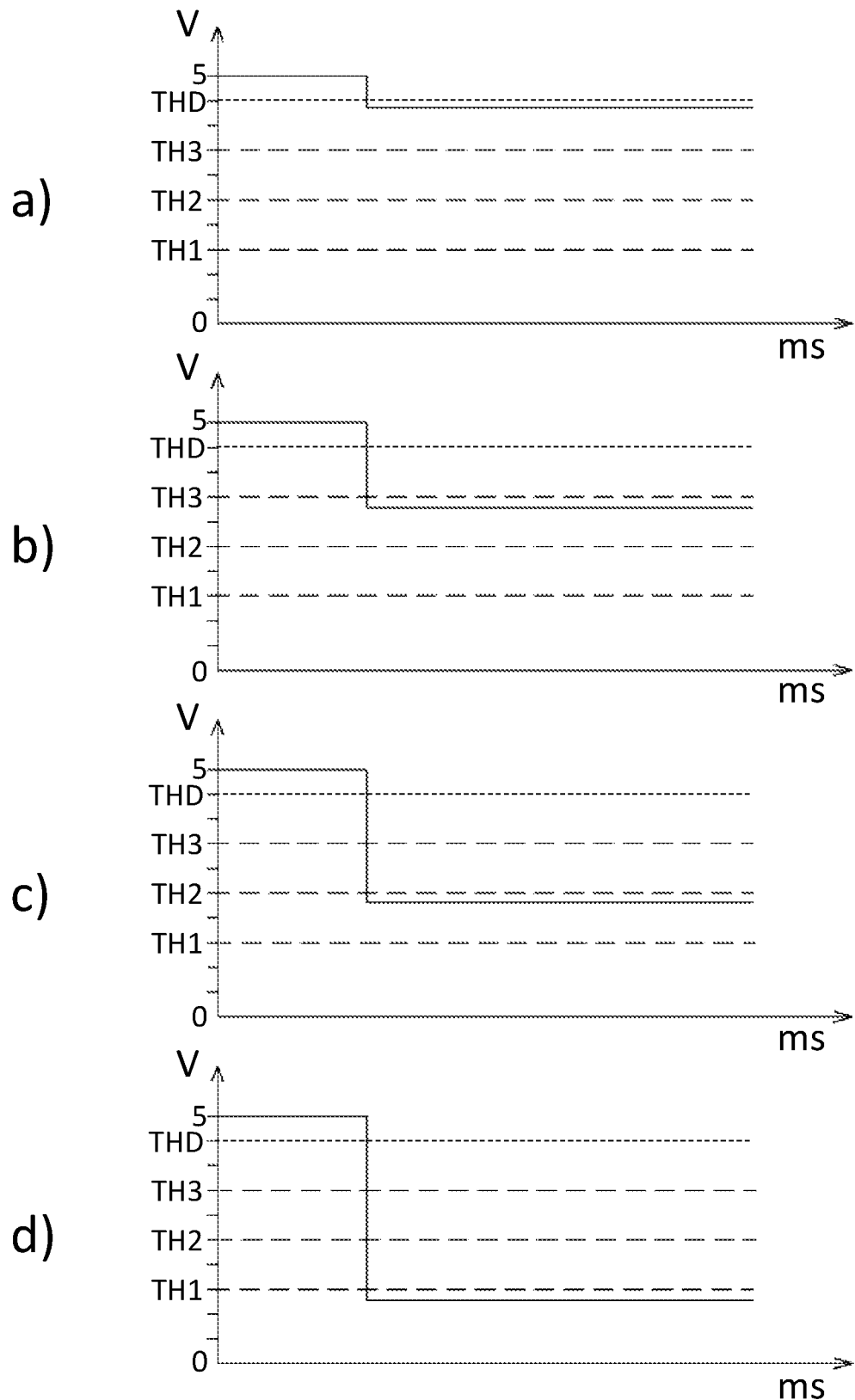
FIG. 26 is a schematic representation, via graphs, aimed at exemplifying a possible principle of interpretation of electrical signals or values used in possible embodiments of the invention.

FIG. 26 exemplifies in graphic and schematic form the measurement principle adopted for the various inputs IN, for example the input $IN_4$. Assume that the initial voltage of 5 V indicated in the graph corresponds to the voltage $V_{DD}$ of FIG. 25. TH1, TH2, and TH3 are three predefined threshold values for the input $IN_4$, i.e., a maximum threshold, a minimum threshold, and an intermediate threshold, respectively, for the condition of electrodes facing the liquid.

The graph in part a) of FIG. 26 expresses the condition that arises in the case where none of the three electrodes $J_4$, $J_{21}$, and $J_{38}$ is facing the fluid, following upon switching of the switch SS of FIG. 25 into its position in which the capacitor $C_{HOLD}$ is connected to the corresponding set of detection electrodes $J_4$, $J_{21}$, and $J_{38}$. In the figure, the falling edge of the voltage represents the decrease in voltage value due to the differential measurement made with the modalities described previously and/or to the fact that, even if they are not facing the liquid L, associated to the three electrodes in question is, in any case, an albeit minimal capacitance, due to the structure of the device. The drop in voltage appearing in the graph of part a) of FIG. 26 may be noted also as regards a given "dry" threshold value, designated by THD, higher than the minimum threshold value TH3, it being possible to use this threshold value THD also for the purposes of discrimination with respect to the three detection thresholds TH1, TH2, and TH3. The drop in voltage in the graph a) remains within the given neighbourhood (for example, the aforesaid +/−40%) of the threshold THD, and in any case above the maximum threshold TH3. The controller 24 hence deduces absence of the liquid in front of the electrodes $J_4$, $J_{21}$, and $J_{38}$.

The graph of part b) of FIG. 26 expresses, instead, the condition that arises in the case where one of the electrodes $J_4$, $J_{21}$, and $J_{38}$ is facing the liquid L. In this case, the reduction in value of the voltage is greater than in the previous case. In addition to the differential measurement, in fact, the overall capacitance associated to the three electrodes is higher than in the previous case, given that one of them is facing the liquid L. The voltage value falls now within the given neighbourhood of the threshold TH3, and from this the controller 24 deduces the presence of liquid in front of just one of the electrodes, i.e., the downmost electrode of the three (the physical position of the electrodes being known to the controller).

The graph of part c) of FIG. 26 expresses, instead, the condition corresponding to that of FIG. 25, i.e., the condition in which two of the electrodes $J_4$, $J_{21}$, and $J_{38}$ are facing the liquid L. The decrease in voltage is now greater than in the case of part b) of FIG. 23 since, in addition to the differential measurement, in the condition in question, the overall capacitance associated to the three electrodes is further increased with respect to the previous case. The voltage value is now in the given neighbourhood of the threshold TH2. The controller 24 hence deduces the presence of liquid in front of the electrodes $J_{20}$ and $J_{37}$ and the absence of liquid in front of the remaining electrode $J_n$, i.e., the uppermost electrode of the three. This discrimination is made considering also that, in the case of conditions of icing or partial solidification of the liquid, it is possible to combine other detections in order to discriminate better this condition, such as a verification and comparison with the state of adjacent electrodes and/or a detection of temperature. Finally, the graph of part d) of FIG. 26 expresses the condition in which all three electrodes $J_4$, $J_{21}$, and $J_{38}$ are facing the liquid L. The decrease in voltage is evidently greater than in the case of part c) of FIG. 23 since, in addition to the differential measurement, in the condition in question, the overall capacitance associated to the three electrodes is maximum. The voltage value is now in the given neighbourhood of the threshold TH1, and hence the controller 24 deduces the presence of liquid in front of the three electrodes $J_{21}$ and $J_{38}$.

As clarified previously, the same findings may be obtained using a simplified logic, i.e., comparing the voltage value with just the three detection thresholds TH1, TH2, and TH3, as follows:
- part a) of FIG. 26: with the voltage value that remains above the threshold TH3, the controller 24 deduces the absence of liquid in front of the electrodes $J_4$, $J_{21}$, and $J_{38}$;
- part b) of FIG. 26: with the voltage value that is comprised between the threshold TH3 and the threshold TH2, the controller 24 deduces the presence of liquid in front of the downmost electrode of the three;
- part c) of FIG. 26: with the voltage value that is comprised between the threshold TH2 and the threshold TH1, the controller 24 deduces the presence of liquid in front of the electrodes $J_{20}$ and $J_{37}$ and the absence of liquid in front of the remaining electrode $J_n$; and
- part d) of FIG. 26: with the voltage value that drops below the threshold TH1, the controller 24 deduces the presence of liquid in front of the three electrodes $J_{21}$ and $J_{38}$.

By scanning the inputs IN with any of the modalities exemplified above, the controller 24 is able to identify the liquid/air transition. In the specific case of FIG. 25, then, the controller 24 can deduce the presence of a liquid/air transition between the electrodes $J_{37}$ and $J_{38}$, thereby identifying the level of the liquid in the tank 1.

From what has been described above, it may be readily understood how the type of embodiment proposed is extremely flexible in relation to the possible lengths required for the level sensor. In other words, with a given controller 24 and substantially given the same number of its analog inputs IN (or with a slightly greater number of inputs IN, as described hereinafter) it is possible to provide level sensors of different lengths, envisaging for detection the use of electrodes J in single configuration, or else two electrodes J in parallel, or else again three electrodes J in parallel, and so forth.

For example, by positioning twenty electrodes J in single configuration, which are 2 mm in height and are set at a distance of 2 mm apart, it is possible to cover a sensitive area for the measurement of level of 78 mm ((20 electrodes+19 spaces between them)×2 mm). When it is necessary to increase the length of the sensitive area (measurement of higher levels) maintaining the same measurement resolution, it is possible to use two electrodes in parallel, or else three, even maintaining the same controller 24.

Preferably, in the presence of first detection electrodes connected in common to further detection electrodes, it is preferable for the physical position of the various sub-arrays of electrodes to be as far away as possible from one another in order to increase the difference of signal and hence the quality of the level information. For this reason, in a preferred embodiment, if a number of sets of detection electrodes connected in common are provided, the electrodes of each set form respective sub-arrays arranged in sequence along the detection axis of the sensor, as may be appreciated, for example, from FIGS. 23 and 24. In general, and with reference for example to FIG. 24, the rule may be applied whereby, given a number y (for example 17) of first electrodes ($J_4$-$J_{20}$) in parallel to second electrodes ($J_{21}$-$J_{37}$), set between each first electrode and the corresponding second electrode there will be y−1 (in the example, 16) electrodes.

Thanks to the type of embodiment described, it is also possible to have different sensitivities of detection of the level. This may be obtained, in the step of production of the part 20a of the substrate with the corresponding electrodes J by positioning the electrodes themselves with a centre-to-centre distance equal to the desired resolution. It is also possible to envisage at least two differentiated resolutions of measurement on the sensitive portion 20b of the sensor, in particular at least one measurement with higher resolution and one measurement with lower resolution, in a lower area and in an upper area of the portion 20b, or vice versa. In such a case, the electrodes in the lower area of the portion 20b may be closer to one another than the electrodes present in the upper area, or vice versa. The minimum distance between two electrodes may, for example, be 1 mm. It is then evident that the dimensions of the electrodes define the level of capacitance that can be measured by the control electronics so that an electrode of higher level will offer a higher dynamics or measurement value.

The electrodes J are preferably (but not necessarily) equal to each other and may for example be obtained with dimensions of 20 mm (length)×2 mm (height) and set at a distance of 2 mm apart. For level sensors having a length shorter than 100 mm—or in the case where it is intended to increase the resolution in an area of the sensitive portion of the sensor—it is possible to reduce the dimensions of the electrodes and hence decrease also the distance between them, precisely to obtain a measurement with higher resolution. In these cases, the electrodes may, for example, have dimensions of 15 mm (length)×1 mm (height) and be set at a distance of 1 mm apart. To maximize the dynamics of measurement for the liquid, for example for the liquid AdBlue here considered (or other solution with urea or different reducing agent), it is moreover preferable to size the electrodes, for any value of their length, in such a way that the height of an electrode is equal to the distance between two contiguous electrodes. Preferably, the spacing between two contiguous electrodes J will be greater than twice the thickness of the wall that separates them from the medium 12.

Figure 27:
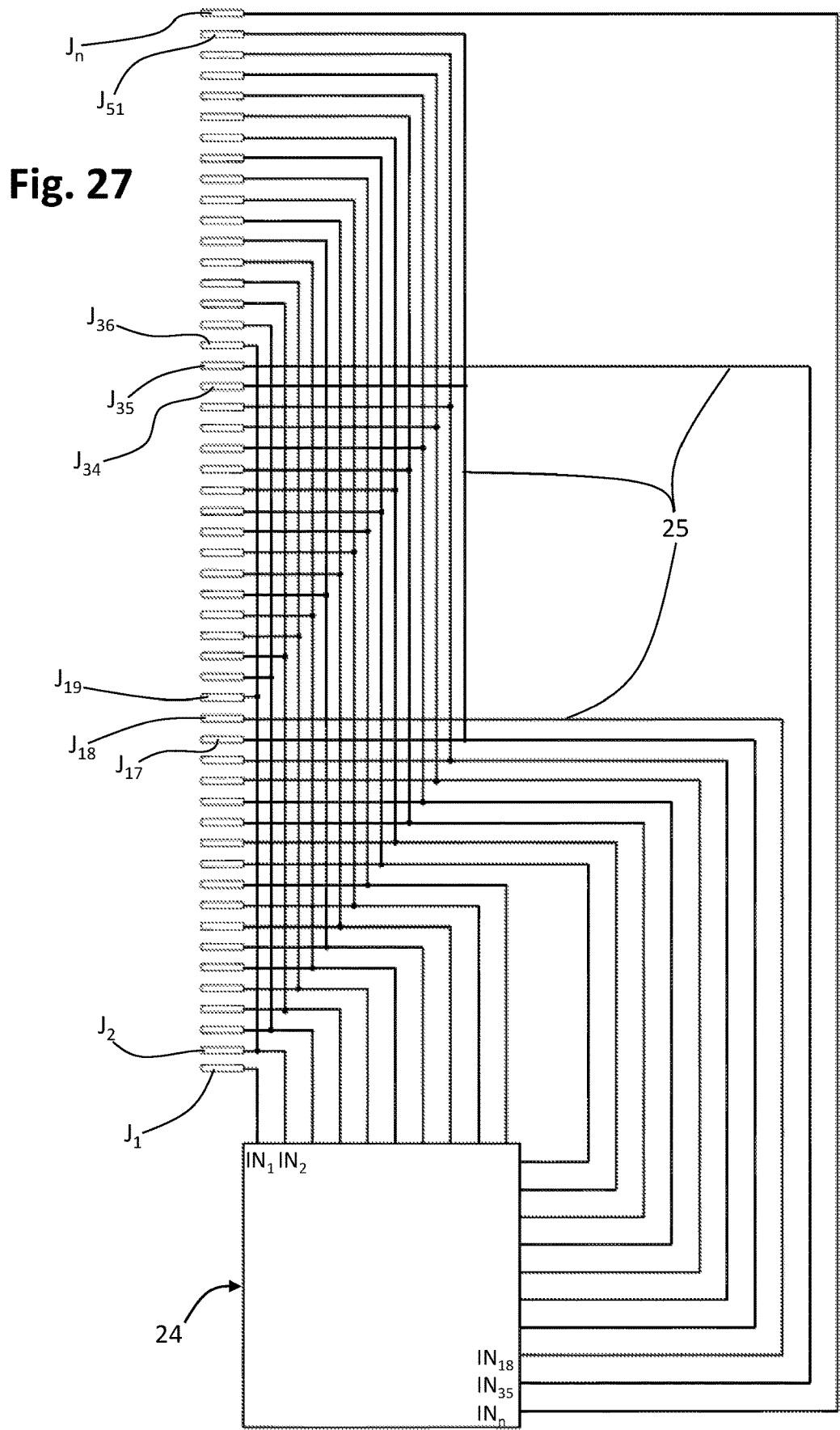
FIGS. 27 and 28 are schematic representations similar to those of FIGS. 20, 23, and 24, aimed at illustrating further possible configurations of connection of electrodes of level sensors according to possible alternative embodiments of the invention.
Figure 28:
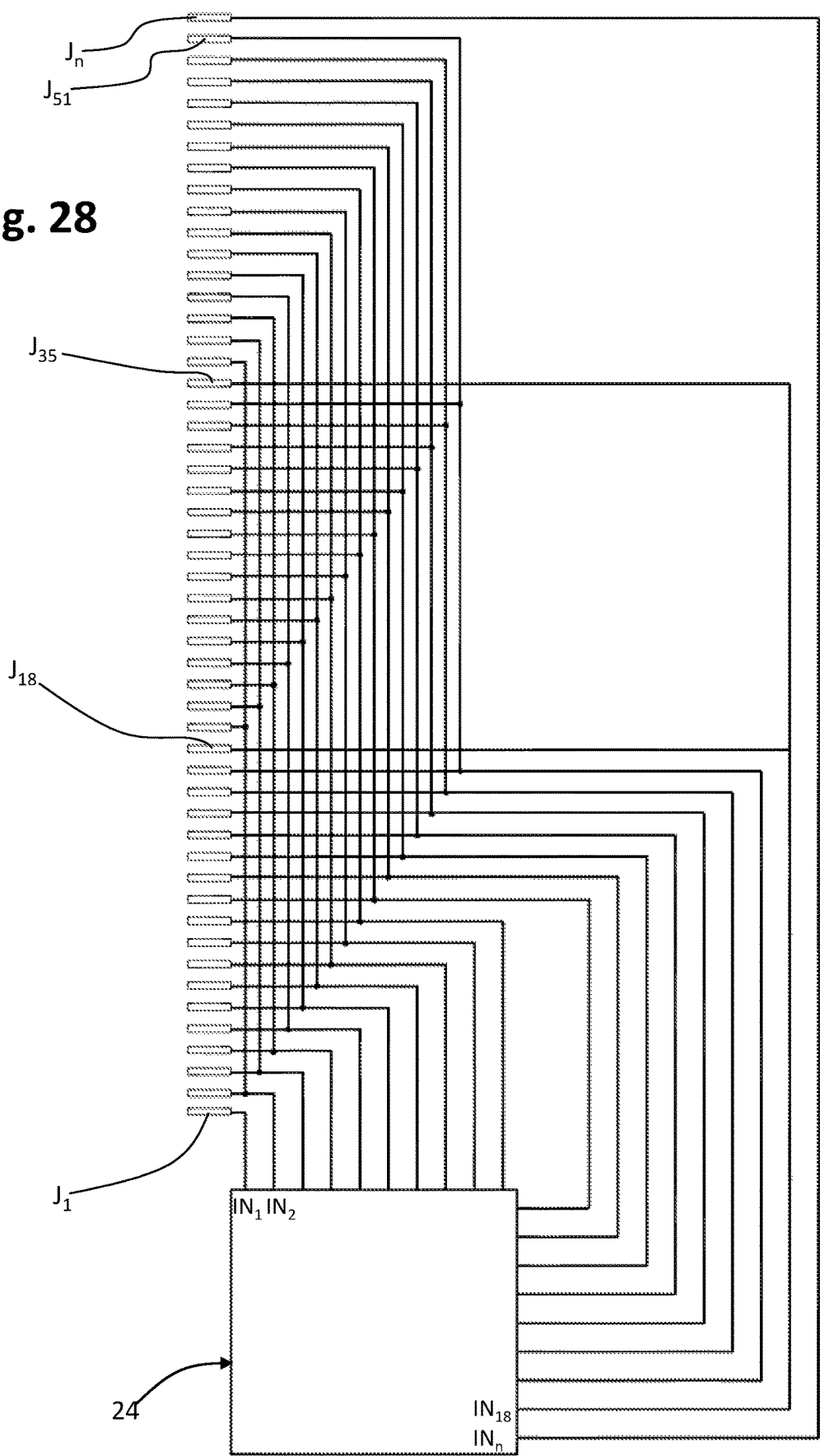

FIGS. 27 and 28 illustrate, with views similar to that of FIG. 24, further possible arrangements that envisage three sets of electrodes J in parallel. In the case of FIG. 27 the two end electrodes of the array illustrated, namely, the electrodes $J_1$ and $J_n$, are not connected in parallel to other electrodes and constitute reference electrodes for the condition of presence and of absence of liquid, respectively, or vice versa, the function of which is preferably programmable or pre-determinable, for example in order to enable installation of the sensor 10 in the tank 1 in the two conditions of FIGS. 1 and 2.

FIG. 27 illustrates a configuration, in part similar to that of FIG. 24, where the array of electrodes include three sub-arrays of first, second, and third detection electrodes connected in common with (i.e., in parallel to) one another, the sub-arrays being separated, however, by individual electrodes. The first electrodes go from the electrode $J_2$ to the electrode $J_{17}$, the second electrodes go from the electrode $J_{19}$ to the electrode $J_{34}$, and the third electrodes go from the electrode $J3_6$ to the electrode $J_{51}$. In this example, the intermediate electrodes $J_{18}$ and $J_{35}$ are, instead, independent and set between the aforesaid three sub-arrays of electrodes. In particular, the single electrode $J_{18}$ is set between the first sub-array ($J_2$-$J_{17}$) and the second sub-array ($J_{19}$-$J_{34}$), whereas the single electrode $J_{35}$ is set between the aforesaid second sub-array and the third sub-array ($J_{36}$-$J_{51}$).

The intermediate electrodes $J_{18}$ and $J_{35}$ enable a clearer distinction between the sub-arrays of electrodes connected in common, in particular in order to detect particular conditions or states of the liquid or other medium undergoing measurement (such as a state of partial solidification or icing of the liquid or medium), in particular a more precise and/or clearer distinction in detection of transitions "liquid-air/gas" and/or "liquid-air/gas solid/ice". For this purpose, it should be considered that the electrodes set between $J_{18}$ and $J_{35}$ enable faster determination of which and/or how many sub-arrays or parts thereof are facing (or not) the medium, it thus being possible to identify more rapidly the areas of uncertainty in which to carry out more accurate measurements, i.e., by detecting the areas of transition between two adjacent electrodes in order to detect, for example, the area of liquid-air transition, as mentioned previously.

The presence of the intermediate independent electrodes is moreover useful in order to discriminate better the values in relation to the aforesaid reference thresholds (such as TH1, TH2, TH3 and/or the "dry" threshold), in particular in the case of a large number of sub-arrays of electrodes in common (or in parallel): in the case of many sub-arrays, there will in fact be present many reference thresholds set closer to one another; for example, in the case where it is preferable, for reasons of costs, to use an ADC with lower resolution (for example, 8 bits instead of 10 or 12 bits), the presence of the aforesaid independent electrode $J_{18}$, $J_{35}$ enables a detection that is clearer and/or more certain, in a way similar to what has been described with reference to the graph b) of FIG. 26, where just the threshold TH3 is considered.

FIG. 28 is substantially similar to FIG. 27, differing only for the fact that the intermediate electrodes $J_{18}$ and $J_{35}$ are not in single configuration, but are connected together in parallel and connected to one and the same input IN. A configuration of this type may be useful for limiting the number of connections to the intermediate electrodes provided, albeit guaranteeing a good distinction of two thresholds (namely, the thresholds TH1 and TH2) associated to one and the same input IN.

With reference to the configurations described by way of example in FIGS. 27 and 28, and considering a larger number of sub-arrays or sets of electrodes connected in common (for example, five or more sub-arrays), a number of intermediate electrodes may be provided, connected in single configuration or else connected in pairs in parallel to one another.

Figure 29:
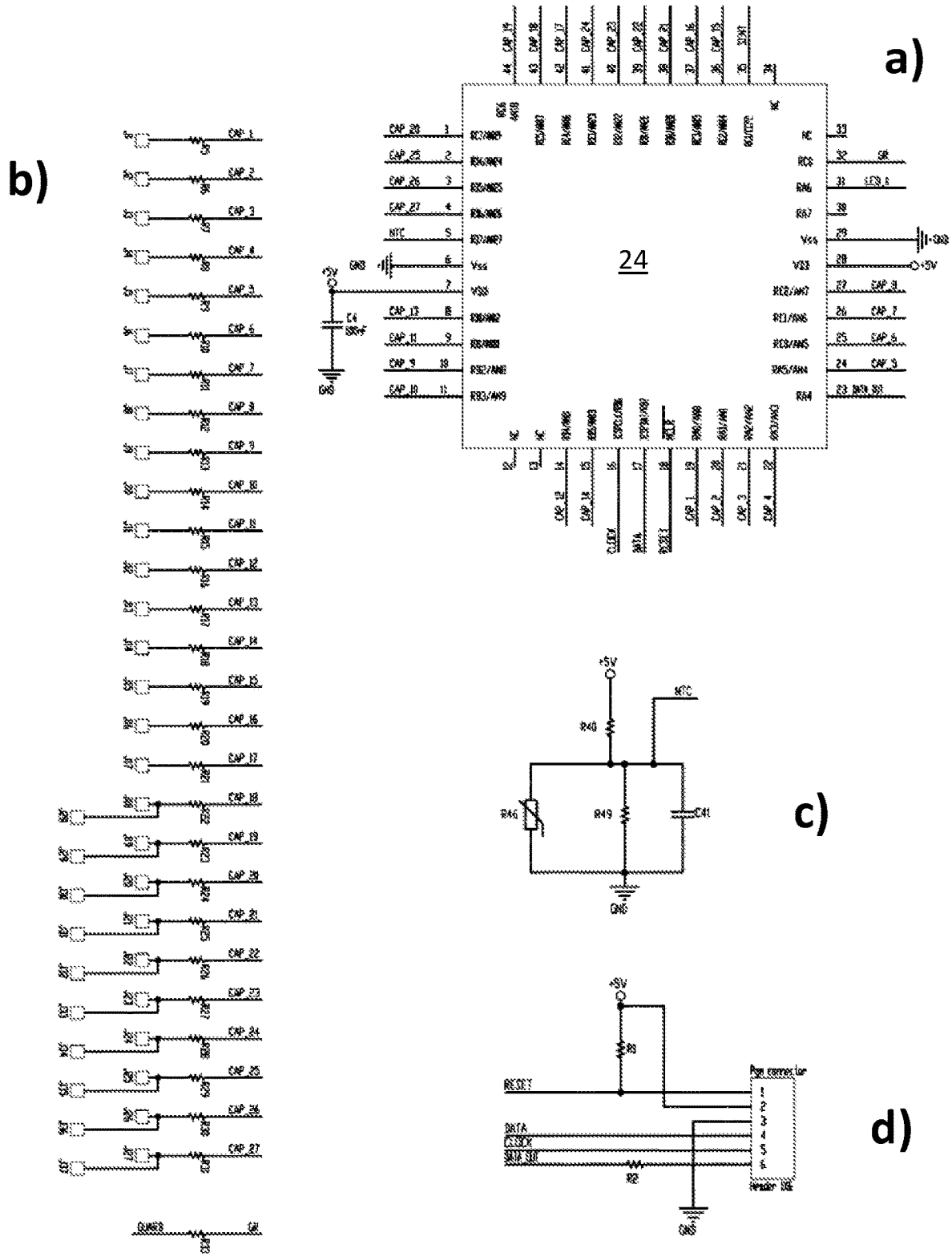
FIG. 29 is a schematic representation of some circuit elements of a level sensor according to a possible embodiment of the invention.

FIG. 29 illustrates some circuit components used in a possible practical implementation of the invention. Part a) of the figure highlights the microcontroller 24 used, here the aforementioned PIC16F1517 manufactured by Microchip Technology Inc., with indication of the corresponding inputs and outputs. Part b) of the figure highlights the electrodes J, which here comprise electrodes $J_1$-$J_{17}$ connected in single configuration to respective inputs of the microcontroller 24, as well as electrodes $J_{18}$-$J_{27}$ connected to respective inputs of the microcontroller 24 in common or in parallel with electrodes $J_{28}$-$J_{37}$. There may be noted, on the connection between each of the electrodes $J_1$-$J_{27}$ and the corresponding input of the microcontroller 24, the aforementioned filter resistance, which may possibly be omitted. Part c) of FIG. 29 illustrates a possible circuit diagram of a temperature sensor that can be used in the device according to the invention, such as for example the temperature sensor 26 and/or 27 of FIG. 7. Finally, part d) of the figure illustrates a possible communication port or electrical connector belonging to the circuit arrangement 23 of FIG. 7, which may be used for example for programming and/or calibration of the level sensor in the production stage. Of course, the circuit arrangement 23 also includes a power-supply stage, not represented, in so far as it may be obtained according to techniques in themselves known.

Thanks to its nature constituted by discrete detection elements, the sensor according to the invention is able to carry out measurements of level in a wide range of situations, which arise for example in SCR systems. A first situation is the typical case, already described previously, where the liquid contained in the tank is entirely in the fluid state. A second situation may arise in the case where the tank is operating in conditions of low temperature, such as to cause total freezing of the liquid present in the tank. Also in this case, the sensor 10 is perfectly able to recognize the electrodes facing the icy mass, and thus calculate its height. A third situation is the one in which the tank contains a predominant liquid part, floating or immersed in which are icy parts ("iceberg effect"): also in this case, the measurement of level carried out by the sensor 10 may take place with the modalities already described above, given that the presence of icy parts does not affect operation of the sensor 10 and calculation of the level. Similar considerations apply to the case where there exists a direct transition between liquid and ice.

Figure 30:
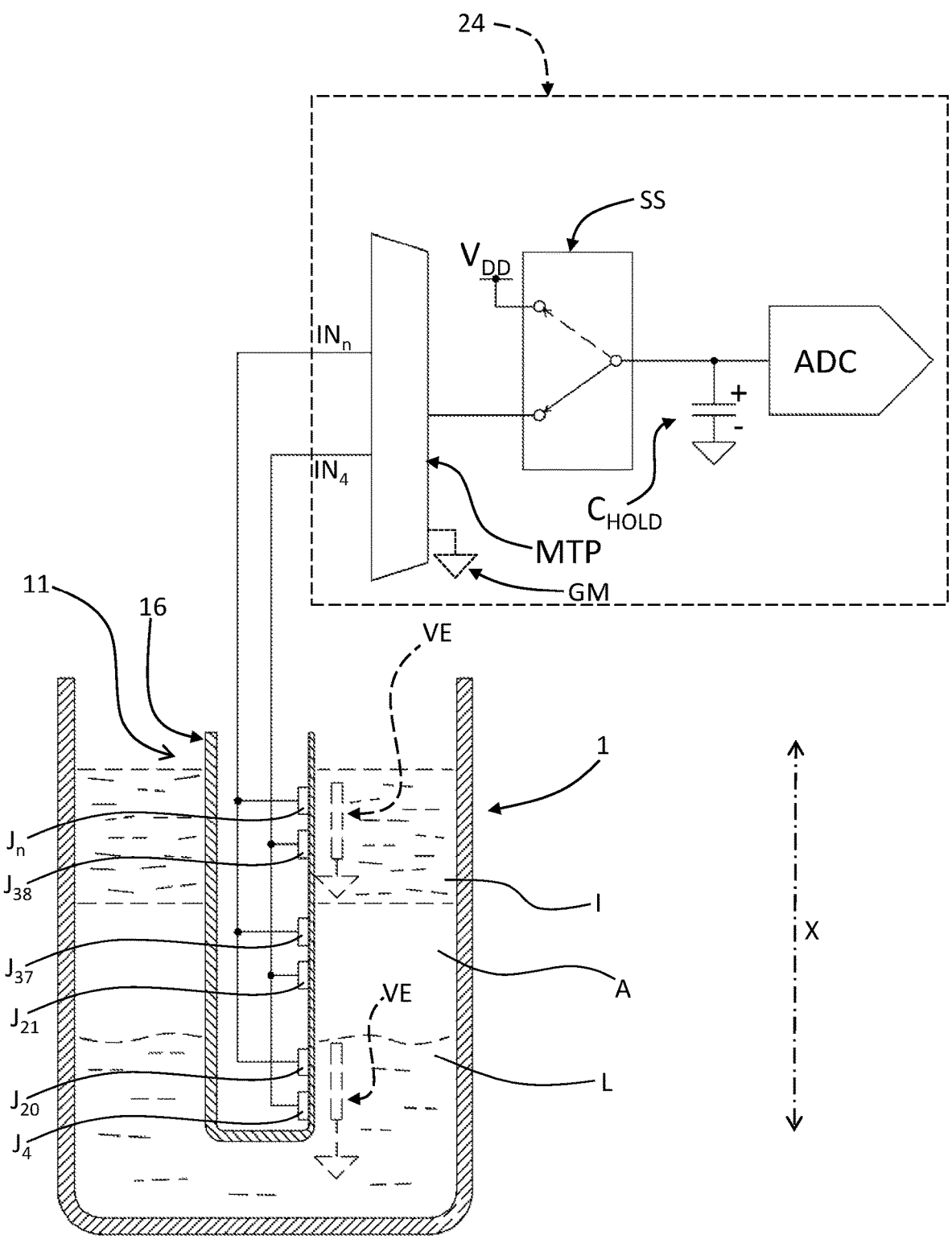
FIG. 30 is a partial and schematic representation similar to that of FIG. 25, aimed at exemplifying a further possible condition of use of a level sensor according to a possible embodiment of the invention.

The sensor 10 is also able to carry out detections in mixed situations, when the liquid-ice system is freezing or unfreezing. A case of this type is illustrated schematically in FIG. 30, where in the upper part of the tank 1 icy liquid is present, designated by I, to form a partial or total "cap". In the lower part of the tank 1, at a higher temperature, the contents L of the tank are already in the liquid state and present between the solid part I and the liquid part L is air, designated by A, or vacuum. Such a condition may, for example, arise in the case of use of the liquid L contained in the tank before it has frozen completely or else after partial unfreezing of the content of the tank that has been obtained via a heater: in such a case, to the part of liquid used there substantially corresponds an intermediate area that is empty or with air between the liquid and the ice. According to one aspect of the invention, in a condition of this sort, it is advantageous to detect the level of the liquid in order to prevent complete use thereof, i.e., in order to leave at least part of liquid in the tank, for the reasons clarified hereinafter.

Also in a condition of the type exemplified, the control electronics of the sensor 10 is able to identify correctly the presence of one or more electrodes ($J_4$, $J_{20}$) facing the liquid L, followed by the presence of one or more electrodes ($J_{21}$, $J_{37}$) facing the air A, in turn followed by one or more electrodes ($J_{38}$, $J_n$) facing the ice I. Advantageously, in a situation of this type, the control electronics of the sensor according to the invention is able to define both the amount/level of liquid content L, which is important in so far as it is the part that can be directly used at the moment by the SCR system, and the total amount of liquid (L+I) present in the tank, which is important for planning topping-up of the tank 1. A possible control logic that can be used for detecting the so-called "igloo effect" (presence of a layer of air overlaid by a layer of ice) may be the following:
- all the detection electrodes that are in the "dry" condition, i.e., facing the air, are alone considered;
- there is evaluated the information acquired on a certain number of electrodes (for example, three) subsequent to a "dry" electrode considered (where by "subsequent" electrodes is meant the electrodes above the "dry" electrode considered, in the case of installation of the sensor from beneath, or else below the "dry" electrode considered, in the case of installation of the sensor from above);
- a check is made to verify whether above a "dry" electrode an electrode—from among the aforesaid subsequent electrodes—is present that is facing the liquid; for this purpose, in a preferred embodiment, the difference is computed between the measurements made on the aforesaid subsequent electrodes and the measurement made on the "dry" electrode considered, and the three individual results are compared with absolute thresholds defined in the design stage; if at least one of these differences coincides or is in the given neighbourhood of the threshold defined, there is detected the presence of the "igloo effect".

It is also possible that, starting from a situation of the type represented in FIG. 27, the tank is topped up, thus introducing a part of liquid L, which, however, may be blocked by the cap of ice I still present in the tank 1. On the basis of the principles set forth above, also in this case the sensor according to the invention is evidently able to detect the increase of the total level of liquid present in the tank 1. Once again with reference to situations of the type represented in FIG. 27, it will be appreciated that, if need be, the electronics of the sensor 10 may be programmed for carrying out successive detections, spaced apart from one another by a certain period of time (for example, 2 min), in order to detect progressive evolution of unfreezing of the cap of ice I.

As already mentioned, the electronics of the sensor forming the subject of the invention is initialized and calibrated in the production stage, with storage of the corresponding software and of the corresponding variables, amongst which one or more of the reference thresholds that depend upon the physical configuration of the sensor-tank system, amongst which the minimum thresholds representing the condition of an electrode or a set of electrodes not facing the fluid. The minimum threshold for the opposite case (liquid facing an electrode) may be predefined following upon experiments and/or may be defined via a further testing with the sensing part 11 of the sensor completely immersed in the liquid. In the case where the sensor 10 envisages electrodes in parallel, also the intermediate thresholds between the minimum threshold and the maximum threshold are then defined experimentally.

The temperature information that can be acquired via the sensor 27 and/or 26 may be used by the electronics 23 for recognizing the situation of the tank system, for example in order to deduce the condition of freezing of the liquid and activate a corresponding heater, and/or in order to compensate mathematically the information on the level measurement, in particular in the case of applications at critical temperatures where the use of a differential measurement with the reference electrode might not be sufficient to guarantee error compensation.

It is emphasized that, to be able to cause via a heater unfreezing of certain icy liquids, such as the additive AdBlue considered herein, it is necessary for there to be in any case present in the tank a part of unfrozen liquid in such a way that the heater can continue to heat the liquid and this transmits the heat to the icy mass. In the application to an SCR system, when the vehicle engine is started, the additive is drawn off, and this is not a source of particular problems provided that in the tank there still remains in any case a certain amount of heated additive, which can reach the icy mass as a result of the movement of the vehicle and consequent mixing of the hot liquid in the tank 1. If, instead, initial drawing-off of the additive determines emptying of the entire liquid residue contained in the tank, the thawing effect stops. For this reason, in a preferred embodiment, the sensor according to the invention may be pre-arranged, for example at a software level, for detecting the level of the thawed liquid so as to guarantee in any case the presence of a minimum level thereof, sufficient for the thawing effect not to be stopped. For this purpose, the sensor 10 can generate an appropriate signal or datum to the outside world, which may, for example, be used by the electronics on board the vehicle and/or for issuing appropriate warnings.

It will of course be appreciated that, with the sensor forming the subject of the invention, progressive thawing of the icy mass of liquid can also be readily detected as thawing proceeds. The sensor 10 is of course able to operate during heating and/or unfreezing of the liquid or other medium the level of which is to be measured, as well as in the course of its possible freezing.

The sensor 10 is interfaced with an external control system, such as a control unit of the SCR system, via the connector 12b. For this purpose, the control electronics 23 of the sensor is pre-arranged for transmission of data, preferably in a serial format, very preferably using a SENT (Single-Edge Nibble Transmission) interface and/or protocol. The signals sent may comprise, in addition to information representing the level of the medium being measured, also information representing at least one from among the temperature of the medium or of the air present in the tank, the presence of a condition of freezing or solidification of at least part of the medium undergoing measurement, the presence of an anomalous operating condition, a warning and/or state signal.

From what has been described previously, it may be appreciated how operation of the level sensor described is substantially independent of the dielectric constant of the medium undergoing measurement. The sensitive element represented by the array of electrodes is able to carry out the measurement of level even if it is completely isolated from the liquid, thereby guaranteeing its protection from contact with aggressive liquids, such as AdBlue or urea, and bestowing a good mechanical strength on the structure of the sensor. In this perspective, the thickness of the wall of the casing 16, in particular in the area facing the electrodes J, may be indicatively comprised between 0.1 and 5 mm, preferably between 0.6 and 1 mm, very preferably approximately 0.8 mm. As already mentioned, the casing may be replaced by a direct overmoulding of plastic material on the sensitive element, or by a generic wall for insulation of the electrodes J, with a thickness like the one indicated above.

The sensor described may have any length and is hence readily adaptable to the inside of any container. A problem present in application of level sensors is precisely represented by the length of the sensor, i.e., the height of the level that is to be measured, which is a variable that depends upon the tank on which the sensor is installed. In this context, the invention enables:

use of a standardized electronics, i.e., a number of components as small as possible, with a microcontroller that, given the same or practically the same number of inputs, can handle a wide range of lengths thanks to the possible connection in common or parallel of a number of sub-arrays of electrodes; and use of a highly flexible circuit diagram for the various possible lengths required for the sensor, i.e., use of one and the same microcontroller with the same number of inputs also for level sensors of different lengths.

As already mentioned, by positioning for example 20 electrodes having a height of 2 mm at a distance of 2 mm apart, a sensitive area for the measurement of level having a length of 78 mm is obtained, i.e., a sensitive area having a length of 78 mm for a set of first electrodes. When it is necessary to increase the length of the sensitive area, it is possible to use the same number of inputs by providing second electrodes in parallel to the first. In this way, it is possible to maintain the same microcontroller, both for reasons of cost and in terms of design. By way of non-limiting example, with ten sub-arrays of electrodes it is in theory possible to reach lengths close on 780 mm. For lengths of this sort it is on the other hand possible to reduce the number of sub-arrays of electrodes, in the case where a lower measurement sensitivity or resolution is acceptable at least in some parts or for some levels of the sensor. For this purpose, as already mentioned, it is for example possible to increase the distance between the electrodes in the areas where the measurement precision is less significant (such as a level close to the full-tank level) and reduce, instead, the distance to obtain a higher resolution in areas considered more critical (for example, in the proximity of a minimum level in the tank).

In various embodiments described previously, installation of the sensor 10 on the bottom wall of the tank has been assumed, in such a way that the electrode designated by $J_1$ represents the electrode set furthest down in the tank itself. Obviously, as explained, installation of the sensor may be made also on the upper wall of the tank, in which case—with reference to the examples illustrated—the electrode $J_1$ is the one closest to the distal end of the portion 20b of the substrate 20, and the electrode $J_n$ is the one closest to the proximal end of the portion 20b. Of course, the control software will be pre-arranged in order to enable level detection according to the point where the sensor is installed, to a further advantage in the flexibility of use.

From the above description, the characteristics of the present invention emerge clearly, as likewise its advantages, principally represented by the simplicity of production of the level sensor proposed, by its contained cost, by its precision and reliability, and by its high flexibility of use and configuration.

It is clear that numerous variations may be made to the devices and to the methods described by way of example by the person skilled in the art, without thereby departing from the scope of the invention as defined by the annexed claims.

Figure 31:
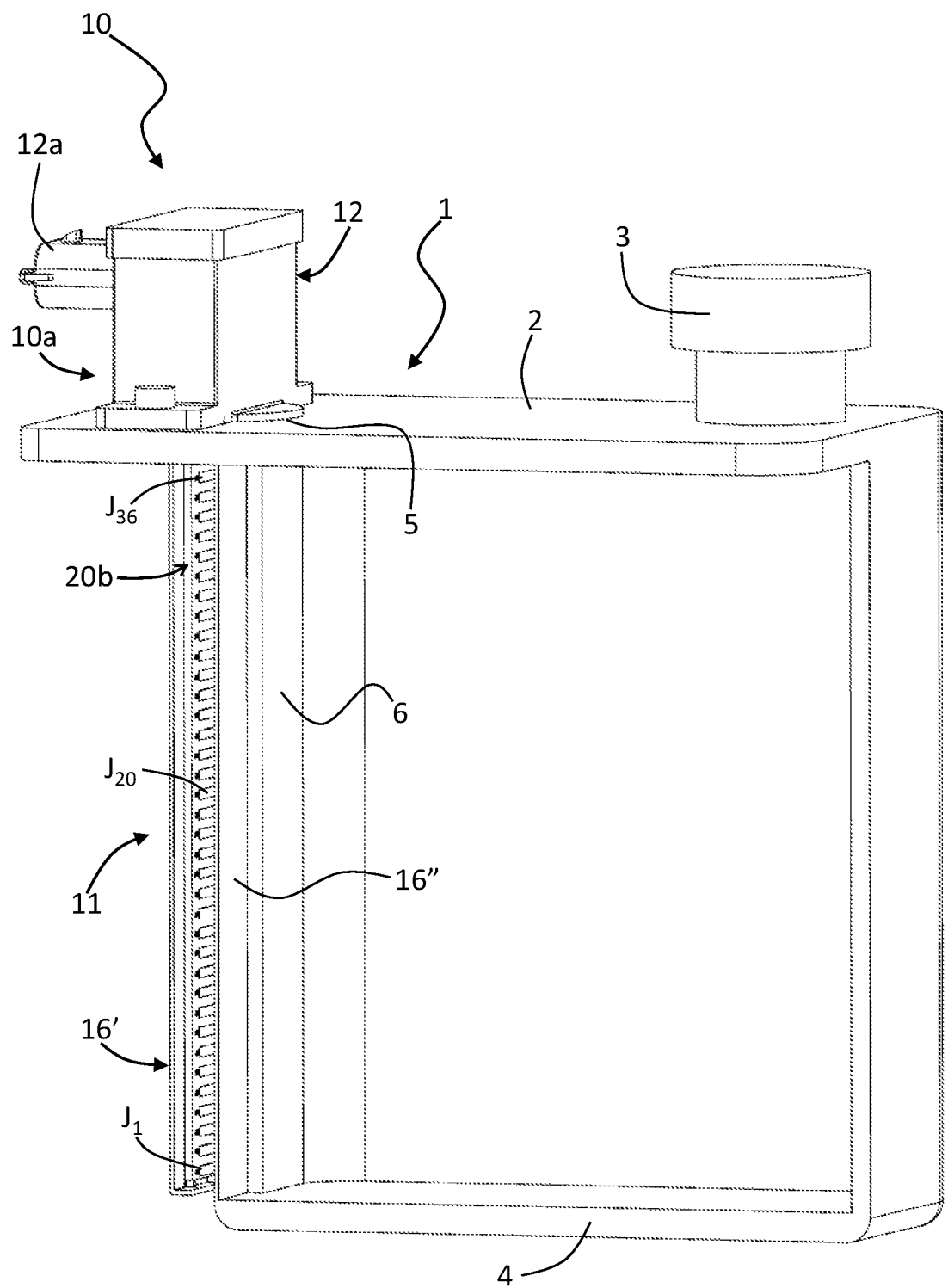
FIG. 31 is a partially sectioned schematic perspective view of a possible variant embodiment of a level sensor according to the invention.

According to possible variants of implementation or application, the level sensor forming the subject of the invention may be arranged on the outside of the container or tank containing the medium undergoing measurement (i.e., on an outer wall or in a seat made in the outer wall of the container or tank), with the array of electrodes J set up against a wall of the container, with possible interposition of the gel G or the like. In this case, the aforesaid wall of the container is appropriately configured in terms of material and thickness in order to provide the layer that insulates electrically the electrodes J with respect to the inside of the container 1. A possible example of embodiment is illustrated in FIG. 31, where the casing of the sensor body 10 is here a casing 16' open laterally, in such a way that the front of the portion 20b of the substrate, and hence the electrodes J, face and/or are set up against a respective portion 16" of a side wall 6 of the tank 1. In the example, this portion 16", which here provides the insulation layer that insulates the electrodes J electrically from the inside of the tank 1, is thinned out with respect to the rest of the wall 6, for example with a thickness comprised between the aforementioned 0.1 and 5 mm.

According to other variant embodiments, the casing 16 and at least part of the corresponding characteristics described previously could be comprised in at least a part integrated in or associated to the container or tank. As already mentioned, the electrodes could be associated directly to a wall or portion of wall of the tank (for example, the portion 16" of FIG. 31), which in this case would constitute both the substrate for the electrodes J and the insulation layer with respect to the contents of the tank.

As mentioned previously, the measurements of capacitance necessary for implementation of the invention may be carried out—in a direct or indirect way—also with sampling or measurement circuits different from those exemplified in FIGS. 21, 22, 25, and 30, even in the absence of means for connecting to ground or to a reference voltage inputs IN different from the one each time connected to the sampling or measuring circuit, such as for example circuits designed to convert the input capacitance into an equivalent resistance. For these cases, for example, a modulator (in particular of a sigma-delta type) may be used for converting the current measured via the equivalent resistance into a digital count. When the medium L faces an electrode J, the capacitance increases and the equivalent resistance decreases. This causes a variation (typically an increase) in the current through the resistance, with a consequent variation (typically an increase) of the digital count, which may be considered as representing the presence of the medium in front of the electrode. Also in implementations of this type, the value of count determined each time at the input IN considered may be compared with one or more reference thresholds and/or be a differential value with respect to one or more reference electrodes, with an approach similar to the one described previously in relation to measurements of capacitance based upon voltage values.

Figure 32:
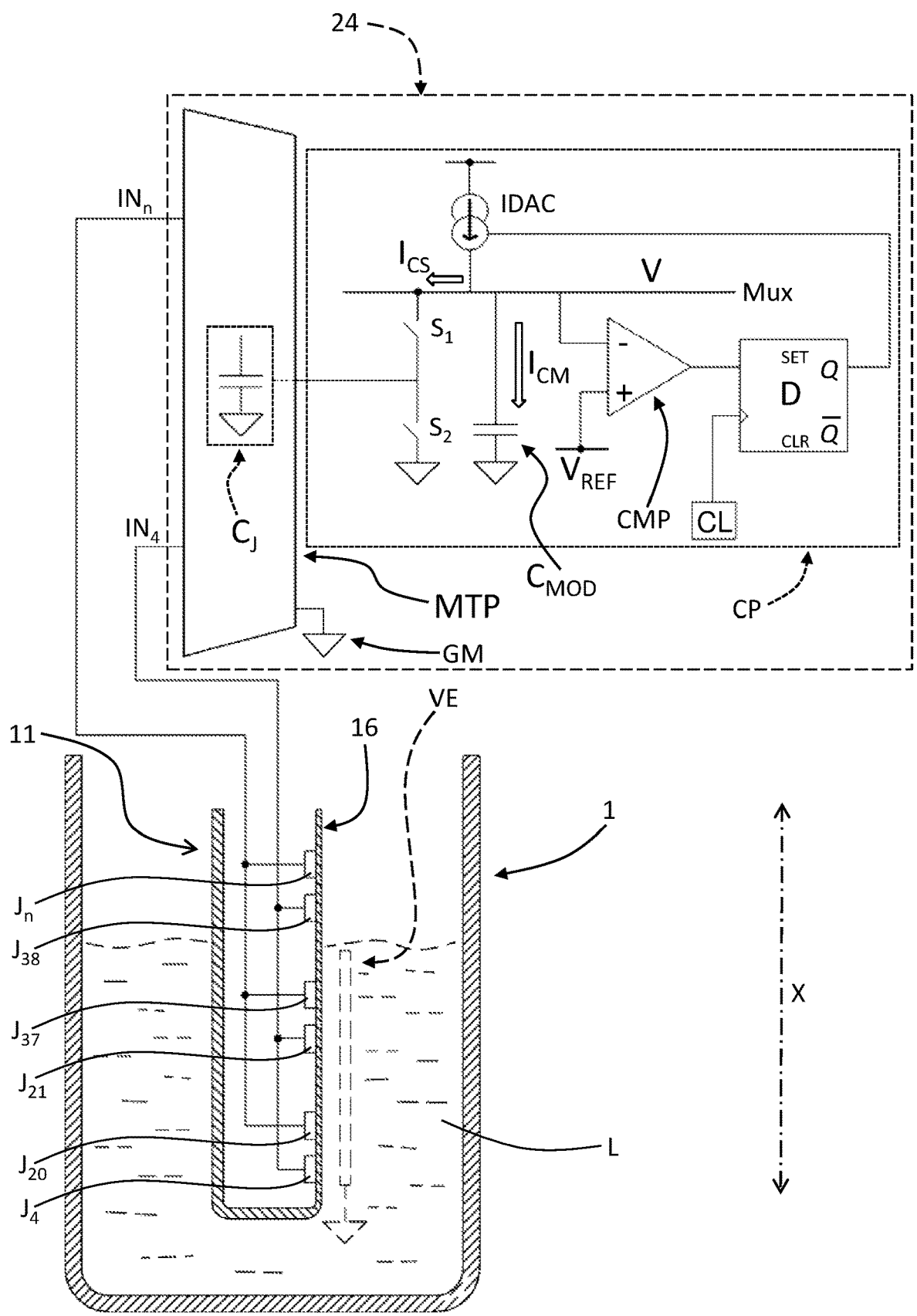
FIG. 32 is a partial and schematic representation aimed at exemplifying a circuit configuration alternative to that of FIG. 25.

An example in this sense is illustrated schematically in FIG. 32, where the block designated by $C_J$ in meant to represent the capacitance associated to the electrode J or to the set of electrodes J each time undergoing measurement. In this example, a sampling circuit CP is provided, where the capacitance $C_J$ (for example, an electrode J or a set of electrodes J) provides, together with the switches $S_1$ and $S_2$, a switched-capacitor circuit. The two switches are controlled via two clocks or timing circuits complementary to one another, not represented. In this way, when the switch $S_1$ is closed, the capacitance $C_J$ is charged by the voltage V, with the charge in $C_J$ that is hence $Q=C_JV$. When $S_2$ is closed and $S_1$ is open, the charge is removed from $C_J$. If the switching frequency of the switches $S_1$ and $S_2$ is Fs, the charge $Q=C_JV$ is transferred at the rate Fs: consequently, the rate of charge transfer per unit time (current) is $I_{CS}=qFs=C_JFsV$.

This equation indicates that the current $I_{CS}$, that the switched-capacitor circuit draws from the analog bus Mux, is directly proportional to the capacitance $C_J$. The converter IDAC supplies a constant current to the analog bus Mux whenever the output Q of the flip-flop D is high and does not instead supply current when the output Q of the flip-flop D is low. The output Q of the flip-flop D is basically the output of the comparator CMP, synchronized with a count clock CL. The current $I_{CM}$ that a reference capacitor $C_{MOD}$ draws from the analog bus Mux is the difference between the current supplied by the converter IDAC and the current drawn off by the switched-capacitor circuit. The voltage V across the capacitance $C_J$ is connected to the inverting input (−) of the comparator CMP, whereas the non-inverting input (+) is connected to a reference voltage $V_{REF}$.

When the capacitance $C_J$ increases (owing to the presence of the medium L in front of an electrode J), the current $I_{CS}$ increases proportionally. The output of the comparator CMP is a PWM signal, and its duty cycle is proportional to the value of $C_J$. This duty cycle is measured via a suitable counter: given that, as has been explained, the capacitance of the electrodes J—and hence the capacitance $C_J$—is affected by the presence or otherwise of the medium L, it is possible to deduce from the aforesaid count which electrode or electrodes J are facing the medium L and which ones are not. Also in this case, the value of count determined each time at the input IN considered (possibly a differential value with respect to one or more reference electrodes) is compared via control or comparator means of the controller 24 with one or more reference thresholds, with an approach similar to the one described previously in relation to measurements of capacitance based upon voltage values. Also in an embodiment of the type illustrated in FIG. 32 there may possibly be provided means for connecting to ground or to a different potential the inputs/electrodes different from the one each time considered for the purposes of detection of the level.

Merely way of example, commercially available microcontrollers suitable for the application exemplified with reference to FIG. 32 may be those identified by the codes CY8C24894-24LFXA and CY8C4245AXI, marketed by Cypress Semiconductor Corporation, San Jose, Calif., U.S.A.

FIG. 32 illustrates the case of sets of electrodes ($J_4$, $J_{21}$, $J_{38}$ and $J_{20}$, $J_{37}$, $J_n$) connected together in common, but the type of implementation described in this figure may be used also with a configuration in which the capacitive elements of the level sensor each comprise a single electrode, in a way similar to what has been described with reference to FIG. 21. Also in this case the presence of the means GM may be envisaged or not.

In a variant, the control logic of the sensor may be pre-arranged for carrying out a first measurement of capacitance on the single input IN (and hence on a single electrode or a set of electrodes in common), without connecting to ground or to a reference voltage the other inputs IN, and then a second measurement in which also inputs IN different from the one being currently sampled are connected to ground or to the aforesaid reference voltage, in order combine two detection techniques for the purposes of a greater safety of detection.

The invention has been described with particular reference to detection of the level of a liquid medium, in particular a urea-based additive, but, as already mentioned, the sensor described may be used in combination with different substances and materials, even potentially subject to solidification for reasons different from freezing (for example, a mass of a powdery or similar material a part of which is compacted or solidified, for example on account of excessive humidity).

The invention claimed is:

1. A sensor for detecting the level of a medium contained in a container, the sensor comprising:
    an array of capacitive elements designed to be associated to the container, so as to extend according to an axis of detection of the level of the medium, the array of capacitive elements comprising a plurality of electrodes, on one face of an electrically insulating substrate having a generally elongated shape, the electrodes being spaced apart from one another along the detection axis, and being substantially coplanar with one another;
    at least one insulation layer for insulating electrically the electrodes with respect to the inside of the container; and
    a controller having a plurality of inputs,
    wherein the controller comprises or has associated a capacitance measuring circuit,
    wherein each capacitive element comprises at least one of a single electrode and a set of electrodes connected together in parallel, the single electrode or the set of electrodes being connected to a respective input of the plurality of inputs,
    wherein the controller is pre-arranged for discriminating a value of capacitance associated to each electrode in order to deduce the level of the medium present in the container,
    wherein the controller is operable for detecting a value of capacitance at each of the inputs of the plurality of inputs in an indirect way, based on a measurement of a voltage or else by converting an input capacitance into an equivalent resistance and then converting the current measured via the equivalent resistance into a digital count,
    wherein the controller comprises or has associated at least one of
        a multiplexing circuit prearranged for connecting selectively each input of the plurality of inputs to the capacitance measuring circuit;
        a reference circuit for connecting to ground or to a reference voltage on or more of the inputs of the plurality of inputs different from the input each time connected to the capacitance measuring circuit;
    wherein the controller comprises or has associated a control circuit, for comparing a digital count determined at said input, or a voltage determined at said input, with at least one corresponding reference value or threshold in order to deduce whether the medium is facing or is not facing the single electrode or an electrode of the set of electrodes,
    wherein the digital count determined at said input or the voltage determined at said input is a differential digital count or a differential voltage, respectively, the controller being pre-arranged for computing the difference between a value of digital count or voltage corresponding said input and a value of digital count or voltage corresponding to an input of the plurality of inputs that is connected to at least one reference electrode, and wherein the control circuit is pre-arranged for comparing the value of the differential digital count or voltage with the at least on reference threshold or value.

2. The level sensor according to claim 1, wherein each electrode is able to provide at least:
a first capacitive configuration or structure having a first value of capacitance when the electrode is facing the medium, or when the level of the medium in the container corresponds to, or is above, the electrode; and
a second capacitive configuration or structure having a second value of capacitance when the electrode is not facing the medium, or when the level of the medium in the container is below the electrode.

3. The level sensor according to claim 1, wherein the controller is pre-arranged for discriminating a value of capacitance associated with each electrode between at least one first value of capacitance and one second value of capacitance in order to identify a transition between the medium and air or gas in the container, that is representative of the level of the medium.

4. The level sensor according to claim 1, wherein: the capacitance measuring circuit comprises a sampling circuit operatively connected or connectable to each input of the plurality of inputs, which includes a controllable switch and a capacitor, the controllable switch being switchable between a first position, where the capacitor is connected to a voltage source, and a second position, where the capacitor is connected to the respective single electrode or set of electrodes, and
the controller comprises or has associated a switching circuit, for switching the switch from the first position to the second position in order to discharge the capacitor in a way proportional to the value of capacitance associated to the corresponding single electrode or set of electrodes.

5. The level sensor according to claim 1, wherein:
each set of electrodes comprises at least one first electrode and one second electrode connected together in parallel; and
the comparator circuit is pre-arranged for comparing the digital count determined at said input, or the voltage determined at said input, with at least two corresponding reference thresholds or values in order to deduce whether the medium is facing or is not facing the first electrode and/or the second electrode.

6. The level sensor according to claim 1, wherein:
the at least one reference threshold or value comprises:
reference thresholds or values in a number corresponding to the number of electrodes of one said set increased by one, or else in a number corresponding to the number of electrodes of one said set; and
the comparator circuit is pre-arranged for comparing the digital count determined at said input, or the voltage determined at said input, with each of the reference thresholds or values in order to deduce whether each of the electrodes of said set is facing or is not facing the medium.

7. The level sensor according to claim 1, wherein the electrodes of respective sets form on the electrically insulating substrate respective sub-arrays of electrodes arranged in sequence along a detection axis,
wherein, given a number y of first electrodes connected in parallel to second electrodes, set between each first electrode and the corresponding second electrode are y−1 electrodes.

8. The level sensor according to claim 1, wherein at least a portion of the electrically insulating substrate is set up against the insulation layer at a face thereof provided with the plurality of electrodes, at least partially in contact with the insulation layer, at a front of the corresponding electrodes.

9. The level sensor according to claim 1, wherein between the insulation layer and a face of the electrically insulating substrate carrying the plurality of electrodes a filling material is present, the filling material being set between the insulation layer and the aforesaid face and/or a front of the electrodes.

10. The level sensor according to claim 1, wherein the array of capacitive elements is contained in an electrically insulating and fluid-tight casing, which defines said at least one insulation layer and is configured for being set within the container according to the detection axis, the casing being a casing defining a respective cavity for insertion of the electrically insulating substrate carrying the electrodes or else being a casing overmoulded on at least one part of the electrically insulating substrate carrying the electrodes.

11. The level sensor according to claim 1, comprising at least one from among:
a sensor body defining an attachment portion configured for fluid-tight coupling at a respective installation opening of the container, the attachment portion having at least one seat for a corresponding elastic element;
a sensor body at least partially made of a mouldable thermoplastic material selected from a polypropylene, a high-density polyethylene, and a cyclic-olefin copolymer;
a sensor body defining a cavity for receiving the electrically insulating substrate, the cavity having guide and or positioning elements for the substrate;
a sensor body having a connector with electrical terminals, where the electrically insulating substrate has electrical contacts configured for elastic coupling with the terminals of the connector, the electrical contacts being arranged in positions corresponding to through holes of the substrate;
a sensor body having positioning elements configured for urging at least a portion of the electrically insulating substrate carrying the electrodes towards the insulation layer, the positioning elements being elastically yieldable and/or deformable;
a sensor body having coupling elements pre-arranged for fast coupling to a wall of the container;
a sensor body having a distal end pre-arranged for releasable coupling with a wall of the container.

12. The level sensor according to claim 1, comprising an electrically insulating substrate carrying the electrodes, wherein the substrate:
has a first portion carrying the plurality of electrodes and a second portion carrying a circuit arrangement including the controller, on the substrate there being provided electrically conductive paths for electrical connection of the electrodes; and/or
has associated at least one temperature sensor; and/or
has a distal end that is spaced apart from a distal end of a corresponding casing, for compensation of any possible expansion; and/or has associated at least one reference electrode in at least one of a distal end portion and a proximal end portion thereof; and/or has associated a plurality of reference electrodes, each at a respective end of an array of the plurality of electrodes or else reference electrodes set between subarrays of detection electrodes; and/or has associated a plurality of reference electrodes, each of which is connected to a respective input of the controller or at least some of which are connected in parallel to one and the same input of the controller; and/or has first electrodes of the plurality of electrodes closer to one another in the direction of the detection axis with respect to second electrodes of the plurality of electrodes, the first electrodes determining a higher measurement resolution than the one determined by the second electrodes.

13. The level sensor according to claim 1, wherein the controller:
is configured for carrying out a sequential sampling of the values of capacitance associated to the inputs of the plurality of inputs; and/or
is a digital electronic microcontroller provided with an analog-to-digital converter, the inputs of the plurality of inputs being analog inputs, and/or
implements a sample-and-hold circuit.

14. The level sensor according to claim 1, wherein the controller is pre-arranged for detecting one or more of the following conditions:
the medium contained in the container is entirely in the fluid state;
the medium contained in the container has passed entirely from a fluid state to a solid or frozen state;
the medium contained in the container has a predominant fluid part floating or immersed in which are parts of the medium in the solid or frozen state;
the medium contained in the container is passing from a fluid state to a state solid or vice versa, such as freezing or unfreezing;
the medium contained in the container includes at least one first part in the solid or frozen state and one second part in the fluid or liquid state, between the first part and the second part there being set a layer of air or gas;
the medium contained in the container comprises at least one part in the solid or frozen state overlaid by a part in the fluid or liquid state.

15. A method for controlling a sensor for detecting the level of a medium contained in a container according to claim 1, the sensor having the plurality of electrodes arranged according to the array that extends according to an axis of detection of the level of the medium, said method comprising the steps of:
i) acquiring electrical signals via first electrodes, which do not face the medium;
ii) acquiring electrical signals via a certain number of second electrodes that are at a greater height than a first electrode considered;
iii) verifying whether above the first electrode considered at least one electrode, from among the aforesaid second electrodes, is present that is facing the medium, and thereby deducing that the medium contained in the container comprises at least one part in the solid or frozen state that overlies a layer of air or gas, where step iii) comprises:
computing the difference between the values representing electrical signals acquired via said second electrodes, and the value representing the electrical signal acquired via the first electrode considered, to compare the individual results with at least one pre-defined value or threshold; and
if at least one of the differences coincides with or is within a given neighbourhood of the pre-defined value or threshold, deducing that the medium contained in the container comprises at least one part in the solid or frozen state that overlies a layer of air or gas.

16. A container, pre-arranged for coupling with a level sensor according to claim 1.

17. The level sensor according to claim 1, wherein the controller comprises a conversion circuit operatively connected or connectable to each input of the plurality of inputs, configured for converting an input capacitance into an equivalent resistance and for converting a current measured via the equivalent resistance into a digital count representing the value of input capacitance.

18. A method for controlling a sensor for detecting the level of a medium, the sensor having an array of capacitive elements designed to be associated to a container, the array of capacitive elements comprising a plurality of electrodes, the electrodes being connected to a plurality of inputs of a control circuit, wherein at least one from among a level, an amount, a state, or a characteristic of the medium present in the container is deduced on the basis of electrical signals acquired,
wherein the control circuit is operable for connecting selectively each input of the plurality of inputs to means for measuring capacitance, and for connecting to ground or to a reference voltage one or more of the inputs of the plurality of inputs different from the input each time connected to the means for measuring the capacitance,
wherein detection of a value of capacitance at each input of the plurality of inputs is made in an indirect way, on the basis of a measurement of voltage or else by converting an input capacitance into an equivalent resistance and then converting the correct measure via the equivalent resistance into a digital input,
wherein a digital count determined at one said input, or a voltage determined at one said input, is compared with at least one corresponding reference value or threshold,
wherein the digital count determined at said input or voltage determined at said input is a differential count or a differential voltage, obtained by computing a difference between a value of digital count or voltage detected for said input and a value of count or voltage detected for an input of the plurality of inputs that is connected to at least on reference electrode,
wherein the control circuit is pre-arranged for comparing the value of the differential digital count or voltage with the at least on reference threshold or value.

* * * * *